(12) United States Patent
Poletto et al.

(10) Patent No.: US 11,789,048 B2
(45) Date of Patent: Oct. 17, 2023

(54) CIRCUIT FOR DRIVING AN INDUCTIVE LOAD, CORRESPONDING DEVICE, VEHICLE AND METHOD

(71) Applicant: STMicroelectronics S.r.l., Agrate Brianza (IT)

(72) Inventors: Vanni Poletto, Milan (IT); Nicola Errico, Milan (IT); Paolo Vilmercati, Pavia (IT); Marco Cignoli, Pavia (IT); Vincenzo Salvatore Genna, Cornaredo (IT); Diego Alagna, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 131 days.

(21) Appl. No.: 17/340,559

(22) Filed: Jun. 7, 2021

(65) Prior Publication Data
US 2021/0389351 A1    Dec. 16, 2021

(30) Foreign Application Priority Data
Jun. 16, 2020   (IT) ................. 102020000014395

(51) Int. Cl.
*G01R 19/165* (2006.01)
*H01H 47/02* (2006.01)
*H01H 47/32* (2006.01)

(52) U.S. Cl.
CPC ......... *G01R 19/1659* (2013.01); *H01H 47/02* (2013.01); *H01H 47/325* (2013.01)

(58) Field of Classification Search
CPC .......... G01R 19/1659; G01R 19/16547; G01R 19/0038; H01H 47/02; H01H 47/325; H02M 1/32; H02M 3/1555; H02M 3/158; H02M 1/0009
See application file for complete search history.

(56) References Cited

U.S. PATENT DOCUMENTS

| | | |
|---|---|---|
| 2005/0237688 A1 | 10/2005 | Wong et al. |
| 2007/0229050 A1 | 10/2007 | Shigeta et al. |
| 2014/0253083 A1* | 9/2014 | Shao ............... H02M 1/32 323/285 |
| 2015/0303805 A1 | 10/2015 | Franchini et al. |
| 2016/0261187 A1 | 9/2016 | Deng |
| 2017/0322240 A1 | 11/2017 | Poletto et al. |
| 2019/0310290 A1 | 10/2019 | Araragi |

* cited by examiner

*Primary Examiner* — Feba Pothen
(74) *Attorney, Agent, or Firm* — Slater Matsil, LLP

(57) ABSTRACT

An embodiment circuit comprises high-side and low-side switches arranged between supply and reference nodes, and having an intermediate node. A switching control signal is applied with opposite polarities to the high-side and low-side switches. An inductive load is coupled between the intermediate node and one of the supply and reference nodes. Current sensing circuitry is configured to sample a first value of the load current flowing in one of the high-side and low-side switches before a commutation of the switching control signal, sample a second value of the load current flowing in the other of the high-side and low-side switches after the commutation of the switching control signal, sample a third value of the load current flowing in the other of the high-side and low-side switches after the second sampling, and generate a failure signal as a function of the first, second and third sampled values of the load current.

22 Claims, 18 Drawing Sheets

CIRCUIT FOR DRIVING AN INDUCTIVE LOAD, CORRESPONDING DEVICE, VEHICLE AND METHOD

CROSS-REFERENCE TO RELATED APPLICATIONS

This application claims the priority benefit of Italian Patent Application No. 102020000014395, filed on Jun. 16, 2020, which application is hereby incorporated herein by reference.

TECHNICAL FIELD

The description relates to techniques for measuring a current in an inductive load. One or more embodiments may be applied to half-bridge driver circuits configured for driving inductive actuators such as solenoids in a vehicle (e.g., in a transmission system or braking system thereof).

BACKGROUND

Half-bridge driver circuits are known in the art, which circuits may be used for driving inductive loads.

As conventional in the art, a half-bridge circuit comprises a high-side switch and a low-side switch connected between a supply voltage node and a reference voltage node (e.g., a ground node), the two switches having an intermediate node therebetween. The switches in the half-bridge circuit may comprise solid state switches such as metal-oxide-semiconductor (MOS) field-effect transistors.

According to known arrangements, the half-bridge driver circuit may be provided within an integrated circuit (IC). The load, usually external to the half-bridge circuit, may be connected between the supply voltage node and the intermediate node of the half-bridge circuit in a so-called "low-side driver" configuration, or between the intermediate node of the half-bridge circuit and the reference voltage node in a so-called "high-side driver" configuration.

According to known driving schemes, the high-side switch and the low-side switch may be driven by respective complementary control signals switching between a high value ("1", e.g., to close the switch) and a low value ("0", e.g., to open the switch).

Certain arrangements are known, wherein the values of the current flowing in the load before and after commutation of the switches are compared one to the other to determine whether a failure may have occurred in the device. The current may be sensed either at a peak of the load current or at a valley of the load current. Sensing may be performed at the high-side switch and at the low-side switch of the half-bridge arrangement. For instance, a failure signal may be issued if the difference between the high-side current and the low-side current (or vice-versa) exceeds a threshold value.

Document US 2017/0322240 A1 is exemplary of such prior approach.

SUMMARY

An object of one or more embodiments is that of measuring a current in an inductive load with improved accuracy with respect to the known solutions.

In particular, one or more embodiments may facilitate compensating a variation of the load current which may take place between a first current measurement, effected before commutation of the driver circuit, and a second current measurement, effected after commutation of the driver circuit.

According to one or more embodiments, such an object can be achieved by means of a circuit having the features set forth in the claims that follow.

One or more embodiments may relate to a corresponding device (e.g., a transmission control unit or a braking control unit for a vehicle).

One or more embodiments may relate to a corresponding vehicle.

One or more embodiments may relate to a corresponding method of operating the circuit.

The claims are an integral part of the technical teaching provided herein in respect of the embodiments.

According to one or more embodiments, a circuit may comprise a high-side switch and a low-side switch having a node intermediate the high-side switch and the low-side switch. The high-side switch may be configured to provide a current flow line between a supply voltage node and the intermediate node, and the low-side switch may be configured to provide a current flow line between the intermediate node and a reference voltage node. The circuit may comprise a control input node configured to receive a switching control signal, the switching control signal being applied with opposite polarities to the high-side switch and the low-side switch. The high-side switch and the low-side switch may be configured to drive an inductive load coupled either between the supply voltage node and the intermediate node or between the intermediate node and the reference voltage node. During a first portion of a switching cycle of the switching control signal a load current flows in one of the high-side switch and the low-side switch, and during a second portion of the switching cycle of the switching control signal the load current flows in the other of the high-side switch and the low-side switch.

According to one or more embodiments, the circuit may further comprise current sensing circuitry configured to:

sample a first value of the load current flowing in the one of the high-side switch and the low-side switch at a first sampling instant during the first portion of a switching cycle before a commutation of the switching control signal, sample a second value of the load current flowing in the other of the high-side switch and the low-side switch at a second sampling instant during the second portion of a switching cycle after the commutation of the switching control signal, sample a third value of the load current flowing in the other of the high-side switch and the low-side switch at a third sampling instant during the second portion of a switching cycle after the second sampling instant, and generate a failure signal as a function of the first, second and third sampled values of the load current.

BRIEF DESCRIPTION OF THE DRAWINGS

One or more embodiments will now be described, by way of example only, with reference to the annexed figures, wherein.

DETAILED DESCRIPTION OF ILLUSTRATIVE EMBODIMENTS

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

Throughout the figures annexed herein, like parts or elements are indicated with like references/numerals and a corresponding description will not be repeated for brevity.

The headings/references used herein are provided merely for convenience and hence do not define the extent of protection or the scope of the embodiments.

By way of introduction to the detailed description of exemplary embodiments, reference may be first made to FIGS. 1A to 1D and 2A to 2D.

Figure 1A:
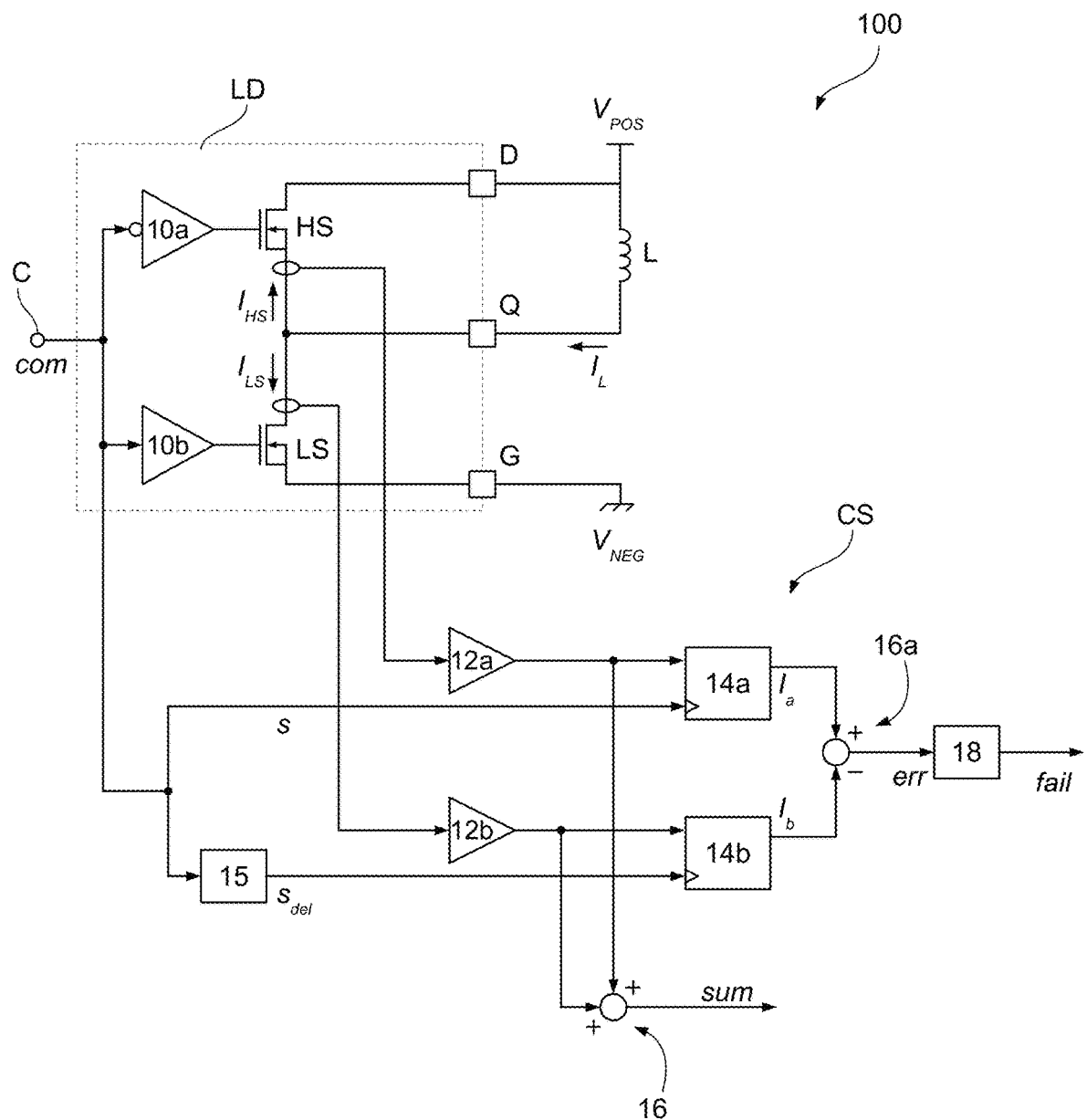
FIGS. 1A to 1D are circuit block diagrams exemplary of circuits configured to drive an inductive load and measure the load current, according to various possible configurations.

FIG. 1A is a circuit block diagram exemplary of a circuit 100 configured for driving a load L, in particular an inductive load L. The circuit 100 comprises a load driver circuit LD and a current sensing circuit CS.

As exemplified in FIG. 1A, the load driver circuit LD may comprise a conventional half-bridge circuit. Therefore, the load driver circuit LD may comprise a high-side switch HS and a low-side switch LS connected between a supply voltage node D and a reference voltage node G (e.g., a ground node). The supply voltage node D may be configured to receive a (e.g., positive) supply voltage $V_{POS}$, and the reference voltage node G may be configured to receive a (e.g., negative or zero) reference voltage $V_{NEG}$. The high-side switch and the low-side switch have an intermediate node Q.

Purely by way of non-limiting example, the supply voltage $V_{POS}$ may be in the range of 6 V to 20 V, with a typical (e.g., nominal) value of about 14 V and a maximum rating of about 40 V.

Purely by way of non-limiting example, the reference voltage $V_{NEG}$ may be in the range of –0.3 V to 0.3 V, with a typical (e.g., nominal) value of about 0 V and a maximum negative rating of about –2 V.

As exemplified in the Figures annexed herein, the switches HS, LS may comprise solid state switches such as, for instance, MOS field-effect transistors.

In particular, FIG. 1A is exemplary of a low-side driver configuration, wherein the load L is connected between the supply voltage node D and the intermediate node Q.

The load driver circuit LD may comprise an input node C configured to receive a digital control signal com which switches between a low value (e.g., 0) and a high value (e.g., 1) to drive commutation of the switches HS, LS. For instance, a first inverting stage 10a may propagate an inverted replica of the signal com to the high-side switch HS, and a second non-inverting stage 10b may propagate a replica of the signal com to the low-side switch LS. The stages 10a, 10b may also bring their output signals to voltage levels adapted for driving the switches HS, LS.

Figure 2A:
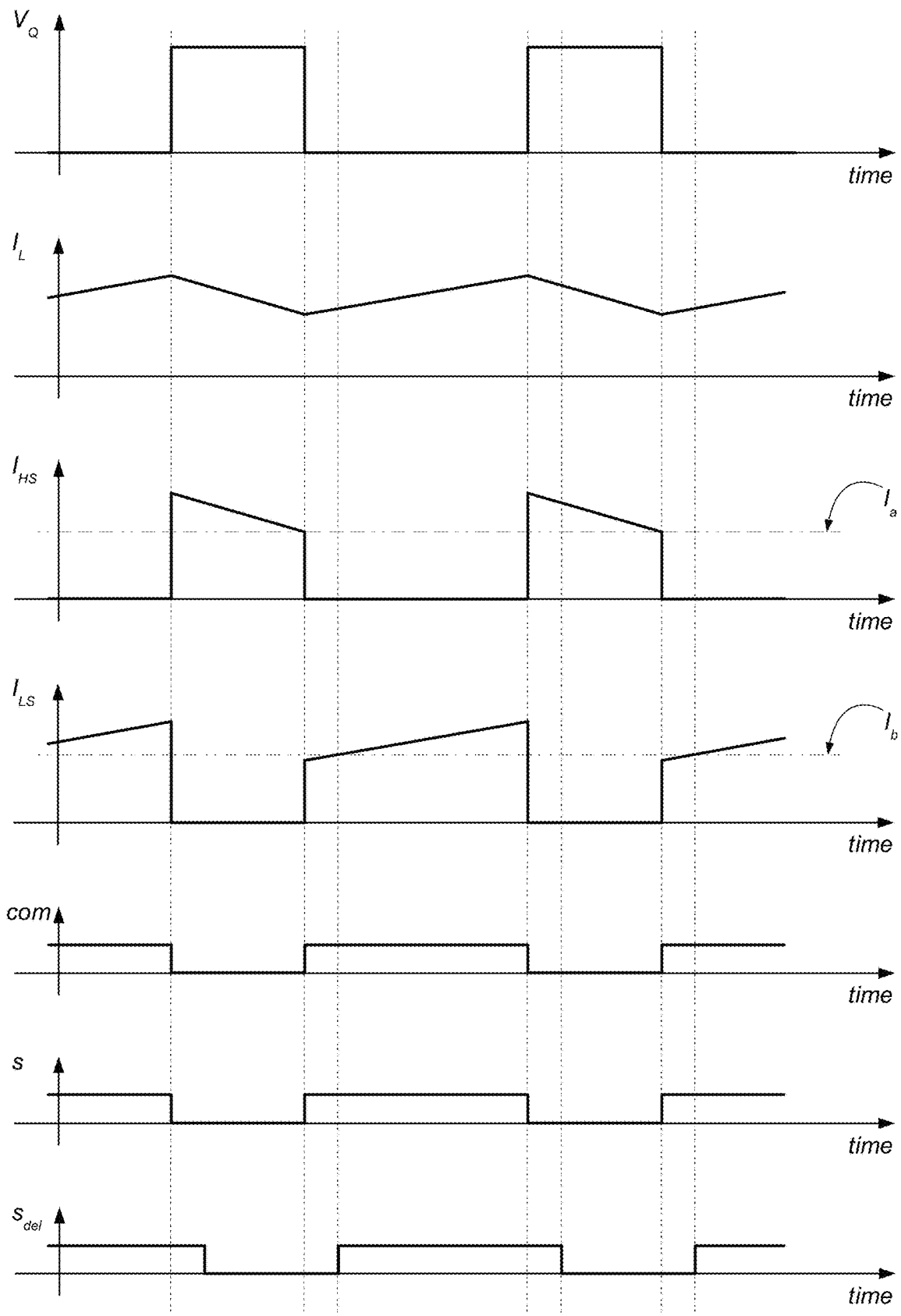
FIGS. 2A to 2D illustrate exemplary waveforms of signals in the circuits of FIGS. 1A to 1D, respectively.

FIG. 2A is exemplary of possible time behavior of signals during operation of the circuit of FIG. 1A. In particular, FIG. 2A illustrates the time behavior of the following signals: $V_Q$ is the voltage at the intermediate node Q, $I_L$ is the current flowing in the load L, $I_{HS}$ is the current flowing in the high-side switch HS, $I_{LS}$ is the current flowing in the low-side switch LS, and com is the digital control signal received at the load driver circuit LD.

As exemplified in FIG. 2A, the switching activity of the control signal com results in a corresponding switching activity at the intermediate node Q between $V_{POS}$ and $V_{NEG}$ (e.g., between 14 V and 0 V), with the current $I_L$ flowing in the load L oscillating between a peak value and a valley value. In a portion of a switching cycle the current $I_L$ flows in the low-side switch, and in another portion of the switching cycle the current $I_L$ flows in the high-side switch.

Purely by way of example, the current $I_L$ flowing in the load L may oscillate between 0 A and 2.5 A. For instance, the peak value may be about 1.5 A, and the valley value may be about 1.0 A.

In particular, FIG. 1A is exemplary of a circuit 100 according to a low-side driver configuration adapted for measuring the currents $I_{HS}$ and $I_{LS}$ at a valley of the load current $I_L$. The current sensing circuit CS may comprise a first current sense amplifier circuit 12a configured to sense the current $I_{HS}$ flowing in the high-side switch HS, and a second current sense amplifier circuit 12b configured to sense the current $I_{LS}$ flowing in the low-side switch LS. The first and second current sense amplifier circuits 12a, 12b may provide respective (digital) output signals indicative of (e.g., proportional to) the respective sensed currents $I_{HS}$, $I_{LS}$.

One or more embodiments may comprise an adder circuit 16 configured to sum the output signals from the first and second current sense amplifier circuits 12a, 12b to reconstruct a (digital) signal sum indicative of the overall current $I_L$ flowing in the load L.

The (digital) output signals from the current sense amplifier circuits 12a, 12b may be sampled by means of respective digital sample-and-hold circuits 14a, 14b. For instance, the sample-and-hold circuits 14a, 14b may comprise sequential circuits such as flip-flops, which may be active on the rising edges of the respective clock signals provided thereto.

The first sample-and-hold circuit 14a may be driven by a clock signal s substantially corresponding to the digital control signal com, and the second sample-and-hold circuit 14b may be driven by a clock signal $s_{del}$ substantially corresponding to a delayed replica of the digital control signal com (as exemplified in FIG. 2A). A delay circuit 15 may be provided between the input node C of the circuit 100 and the clock input of the second sample-and-hold circuit 14b to introduce a propagation delay and generate the clock signal $s_{del}$ starting from the clock signal s.

Generally, the delay introduced by the delay circuit 15 may be adapted so that the low-side current $I_{LS}$ is sampled at the sample-and-hold circuit 14b after the high-side switch HS has (completely) turned off and the low-side switch LS has (completely) turned on. The amount of delay may depend on blanking time of the current sense during the commutation of node Q. Purely by way of non-limiting example, the delay introduced by the delay circuit 15 may be about 10 μs (1 μs=$10^{-6}$ s).

Therefore, a (digital) output signal $I_a$ may be provided at the output of the first sample-and-hold circuit 14a, the signal $I_a$ being indicative of the current flowing in the high-side switch right before a "valley" commutation of the load driver circuit LD. Similarly, a (digital) output signal $I_b$ may be provided at the output of the second sample-and-hold circuit 14b, the signal $I_b$ being indicative of the current flowing in the low-side switch right after a "valley" commutation of the load driver circuit LD (as exemplified in FIG. 2A).

A subtractor circuit 16a may be configured to subtract the signal $I_b$ from the signal $I_a$ to generate a (digital) error signal err indicative of the difference between the outputs of the sample-and-hold circuits 14a, 14b.

A window comparator circuit 18 may be configured to receive the error signal err and generate a (digital) output signal fail indicative of whether the error signal err falls within a determined window of values or not. For instance, the output signal fail may be asserted (e.g., set to 1) as a result of the error signal err being lower than a first (negative) threshold value $V_N$ or higher than a second (positive) threshold value $V_P$, and it may be de-asserted (e.g., set to 0) as a result of the error signal err being within the first threshold value $V_N$ and the second threshold value $V_P$. Possibly, the window may be symmetric, i.e., $V_N=-V_P$.

Therefore, the signal fail may be asserted as a result of the "valley" load currents flowing in the high-side switch HS and in the low-side switch LS differing by more than a threshold value, possibly indicating a failure of the device.

Figure 1B:
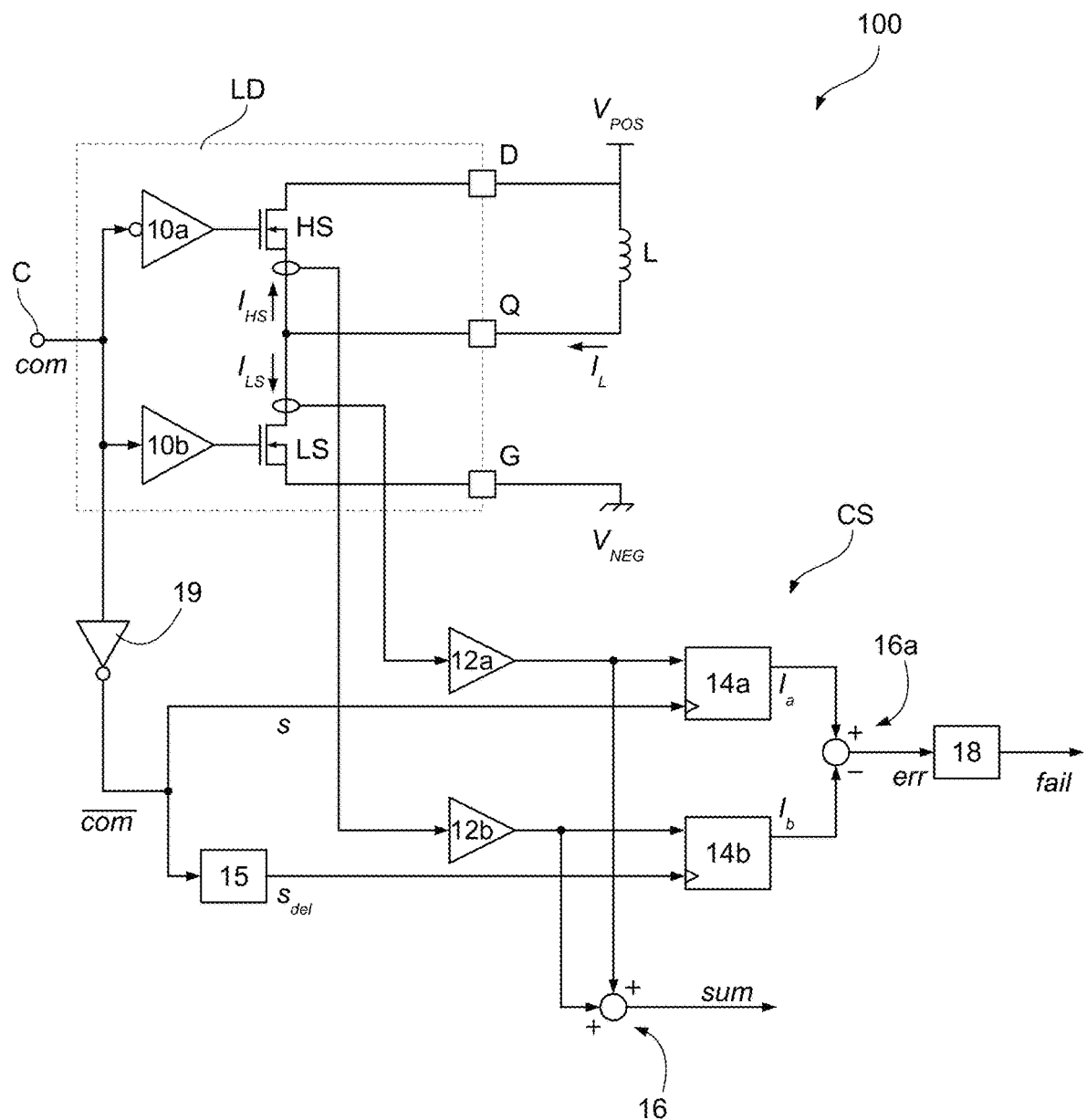
Figure 2B:
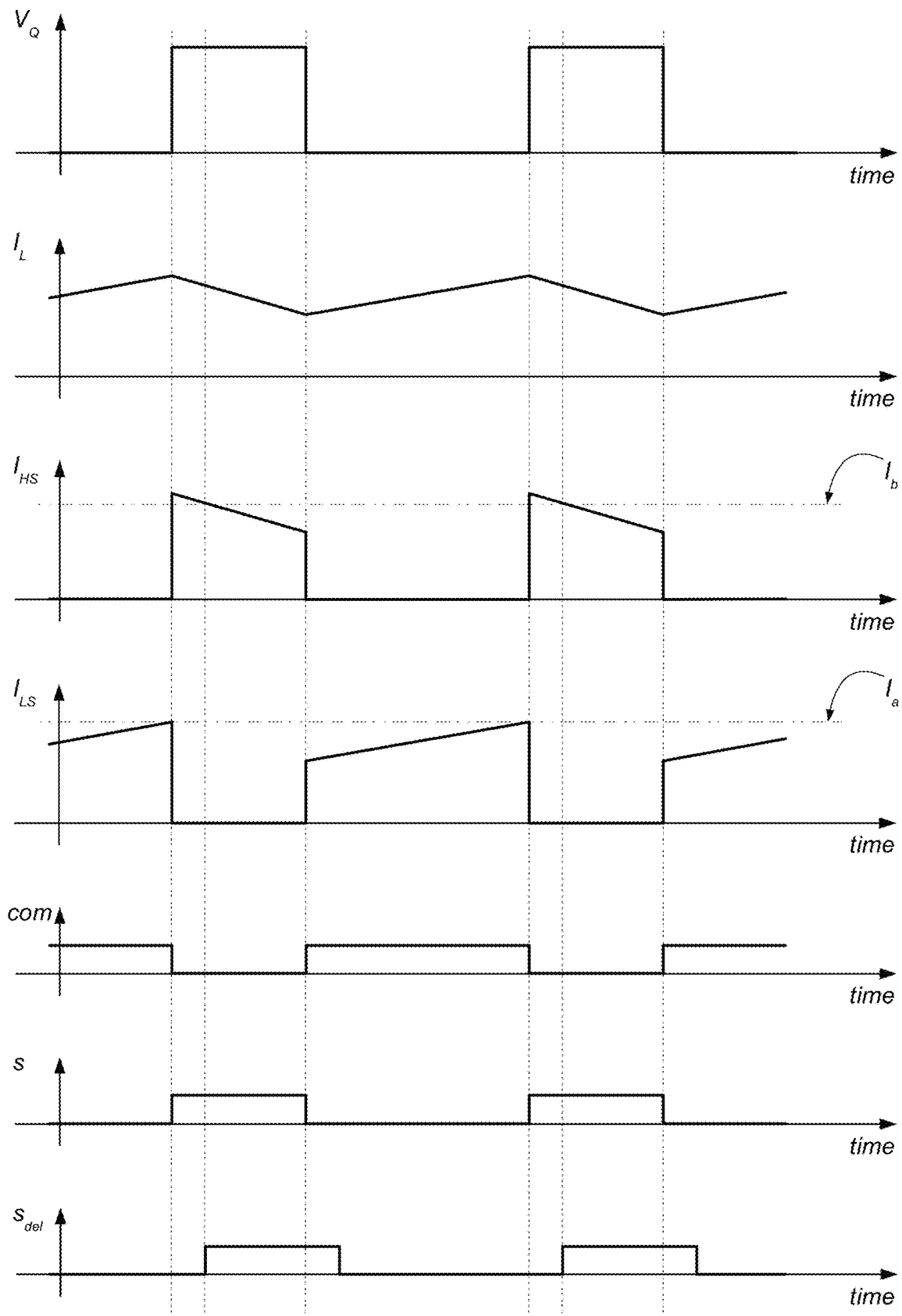

FIG. 1B is exemplary of another circuit 100 according to a low-side driver configuration, where the current sensing circuit CS is adapted for measuring the currents $I_{HS}$ and $I_{LS}$ at a peak of the load current $I_L$. FIG. 2B shows corresponding exemplary waveforms.

By way of contrast with the circuit exemplified in FIG. 1A, in the circuit exemplified in FIG. 1B the first current sense amplifier circuit 12a is configured to sense the current $I_{LS}$ flowing in the low-side switch LS, and the second current sense amplifier circuit 12b is configured to sense the current $I_{HS}$ flowing in the high-side switch HS.

Additionally, in the present example the first sample-and-hold circuit 14a is driven by a clock signal s substantially corresponding to an inverted replica of the digital control signal com, and the second sample-and-hold circuit 14b is driven by a clock signal $s_{del}$ substantially corresponding to a delayed inverted replica of the digital control signal com (as exemplified in FIG. 2B). The inverted replica of the digital control signal com may be generated, for instance, by an inverter circuit 19 as exemplified in FIG. 1B.

Therefore, as exemplified in FIG. 2B, the (digital) output signal $I_a$ at the output of the first sample-and-hold circuit 14a may be indicative of the current $I_{LS}$ flowing in the low-side switch LS right before a "peak" commutation of the load driver circuit LD. The (digital) output signal $I_b$ at the output of the second sample-and-hold circuit 14b may be indicative of the current $I_{HS}$ flowing in the high-side switch HS right after a "peak" commutation of the load driver circuit LD.

Therefore, the signal fail may be asserted as a result of the "peak" load currents flowing in the low-side switch and in the high-side switch differing by more than a threshold value, possibly indicating a failure of the device.

Figure 1C:
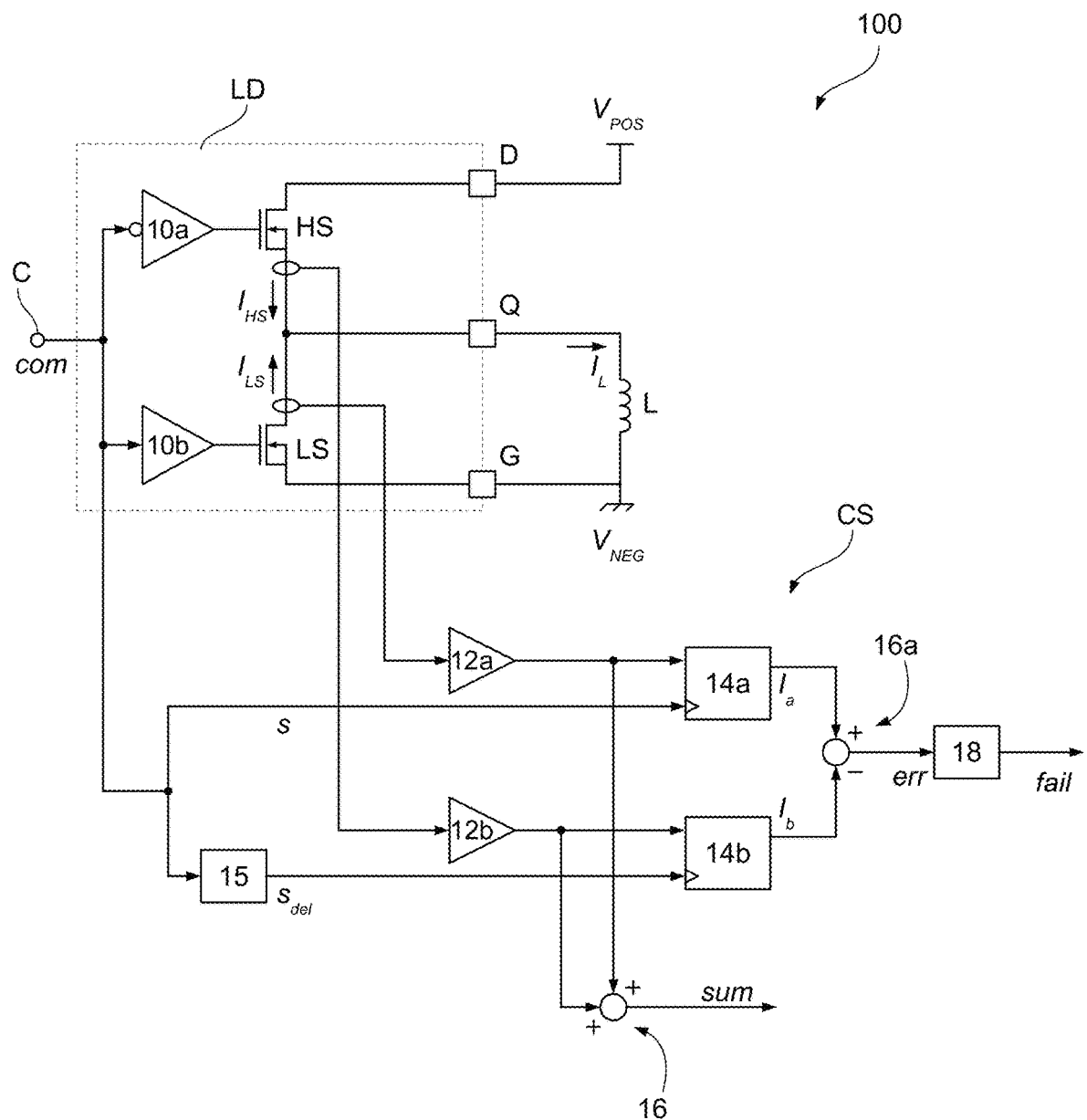
Figure 2C:
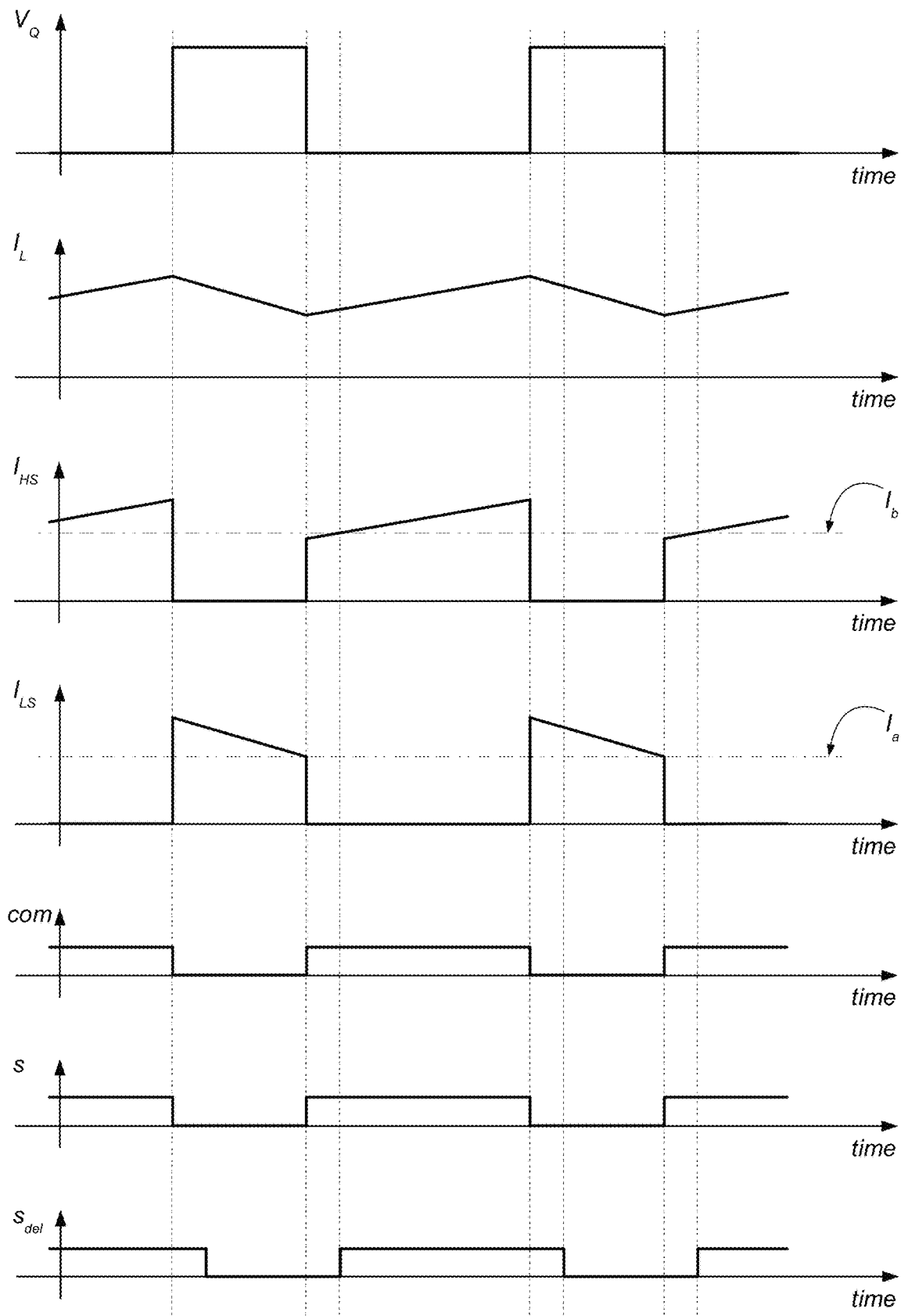

FIG. 1C is exemplary of a circuit 100 according to a high-side driver configuration, wherein the load L is connected between the intermediate node Q and the reference voltage node G. In particular, FIG. 1C is exemplary of a circuit 100 adapted for measuring the currents $I_{HS}$ and $I_{LS}$ at a valley of the load current $I_L$. FIG. 2C shows corresponding exemplary waveforms.

In the presently considered example, the first current sense amplifier circuit 12a is configured to sense the current $I_{LS}$ flowing in the low-side switch LS, and the second current sense amplifier circuit 12b is configured to sense the current $I_{HS}$ flowing in the high-side switch HS.

In this example, the first sample-and-hold circuit 14a is driven by a clock signal s substantially corresponding to the digital control signal com, and the second sample-and-hold circuit 14b is driven by a clock signal $s_{del}$ substantially corresponding to a delayed replica of the digital control signal com (as exemplified in FIG. 2C).

Therefore, as exemplified in FIG. 2C, the (digital) output signal $I_a$ at the output of the first sample-and-hold circuit 14a may be indicative of the current $I_{LS}$ flowing in the low-side switch LS right before a "valley" commutation of the load driver circuit LD. The (digital) output signal $I_b$ at the output of the second sample-and-hold circuit 14b may be indicative of the current $I_{HS}$ flowing in the high-side switch HS right after a "valley" commutation of the load driver circuit LD.

Therefore, the signal fail may be asserted as a result of the "valley" load currents flowing in the low-side switch and in the high-side switch differing by more than a threshold value, possibly indicating a failure of the device.

Figure 1D:
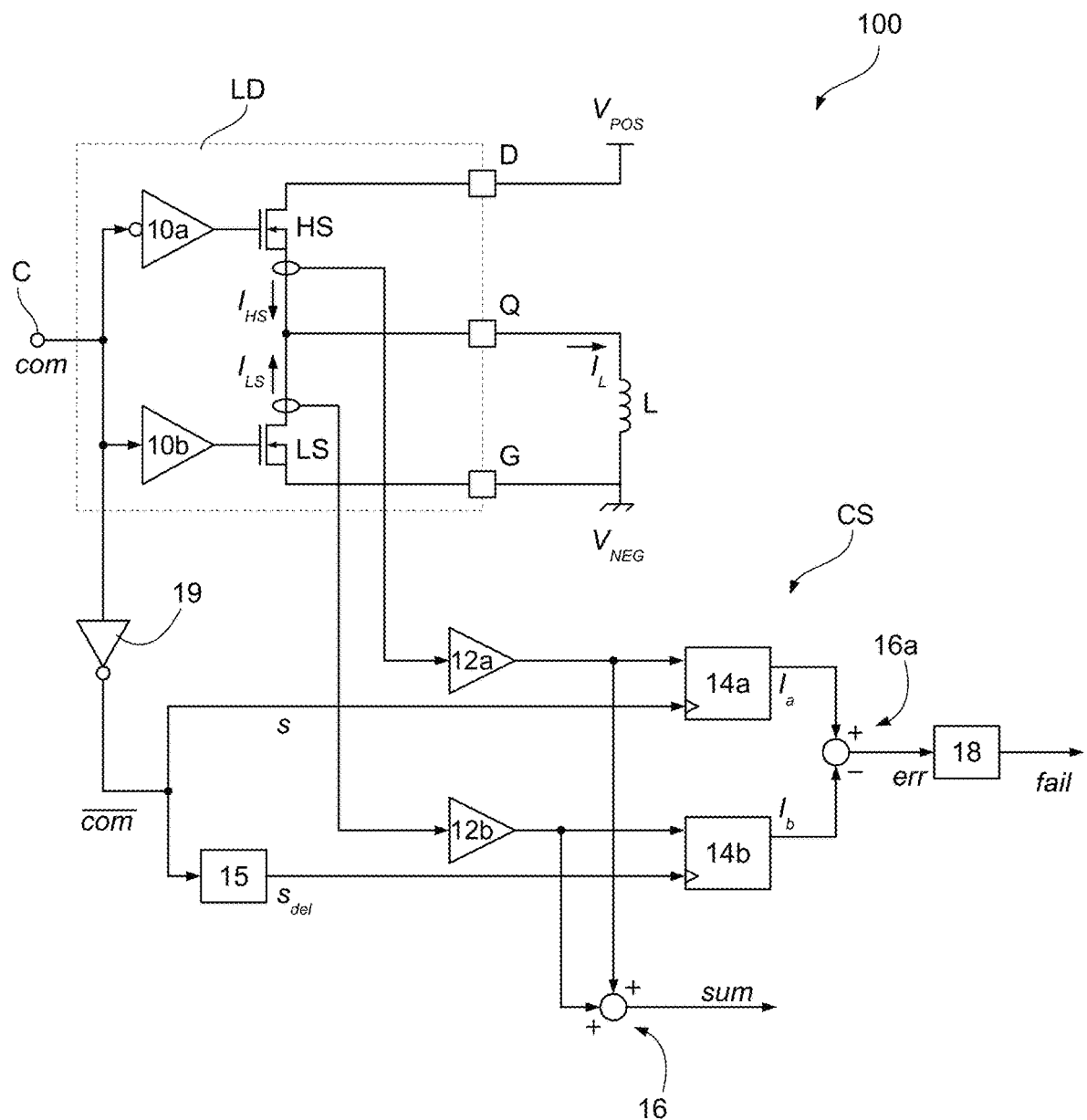
Figure 2D:
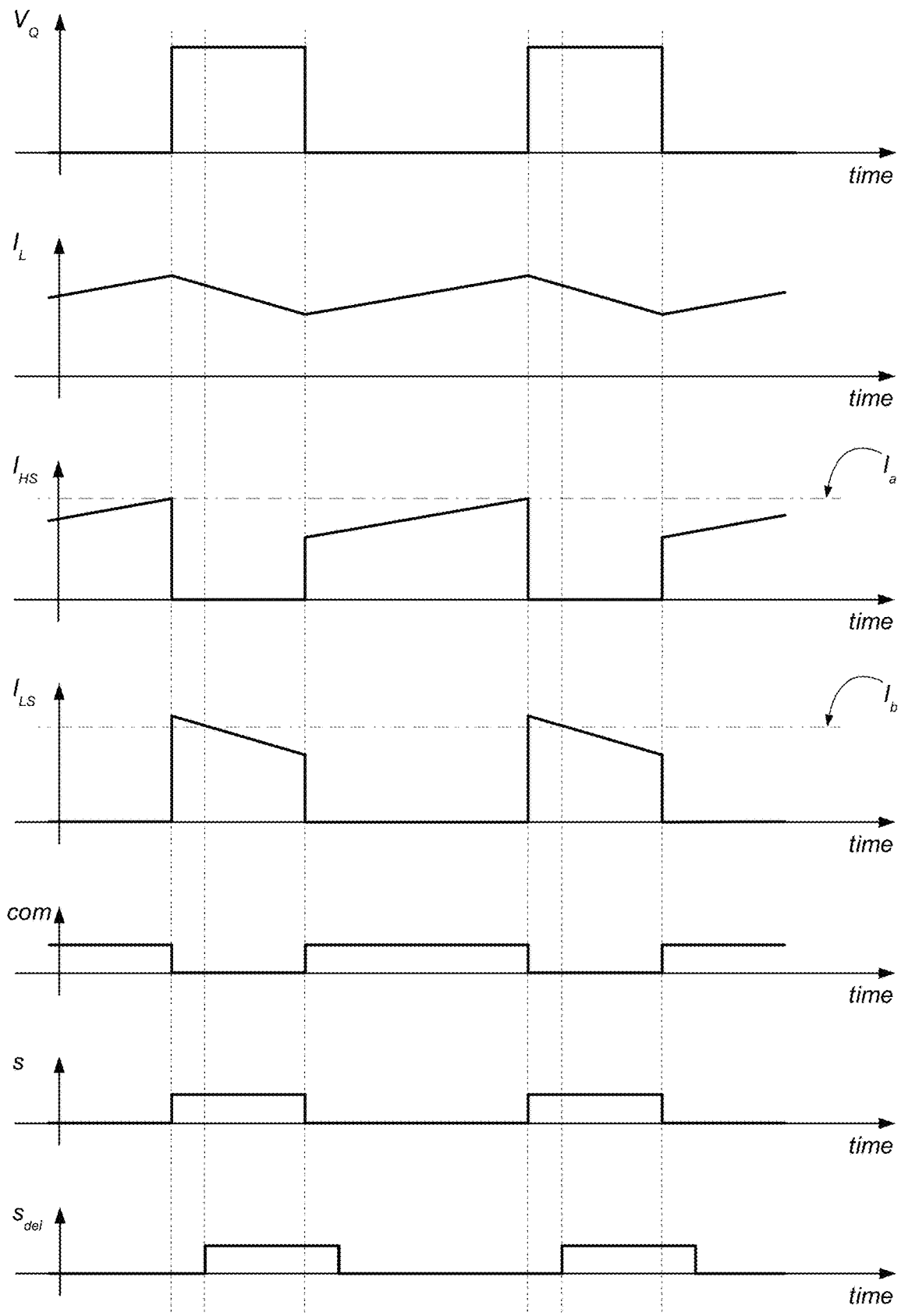

FIG. 1D is exemplary of another circuit 100 according to a high-side driver configuration, wherein the current sensing circuit CS is adapted for measuring the currents $I_{HS}$ and $I_{LS}$ at a peak of the load current $I_L$. FIG. 2D shows corresponding exemplary waveforms.

By way of contrast with the circuit exemplified in FIG. 1C, in the circuit exemplified in FIG. 1D the first current sense amplifier circuit 12a is configured to sense the current $I_{HS}$ flowing in the high-side switch HS, and the second current sense amplifier circuit 12b is configured to sense the current $I_{LS}$ flowing in the low-side switch LS.

Additionally, in the present example the first sample-and-hold circuit 14a is driven by a clock signal s substantially corresponding to an inverted replica of the digital control signal com, and the second sample-and-hold circuit 14b is driven by a clock signal $s_{del}$ substantially corresponding to a delayed inverted replica of the digital control signal com (as exemplified in FIG. 2D).

Therefore, as exemplified in FIG. 2D, the (digital) output signal $I_a$ at the output of the first sample-and-hold circuit 14a may be indicative of the current $I_{HS}$ flowing in the high-side switch HS right before a "peak" commutation of the load driver circuit LD. The (digital) output signal $I_b$ at the output of the second sample-and-hold circuit 14b may be indicative of the current $I_{LS}$ flowing in the low-side switch LS right after a "peak" commutation of the load driver circuit LD.

Therefore, the signal fail may be asserted as a result of the "peak" load currents flowing in the high-side switch and in the low-side switch differing by more than a threshold value, possibly indicating a failure of the device.

It is noted that solutions as exemplified in FIGS. 1A to 1D and corresponding FIGS. 2A to 2D may be affected by systematic errors, e.g., due to the high-side current measurement and the low-side current measurement being performed at different sampling instants. This may result in the measured high-side current and the measured low-side current being different even in non-faulty systems.

Figure 3:
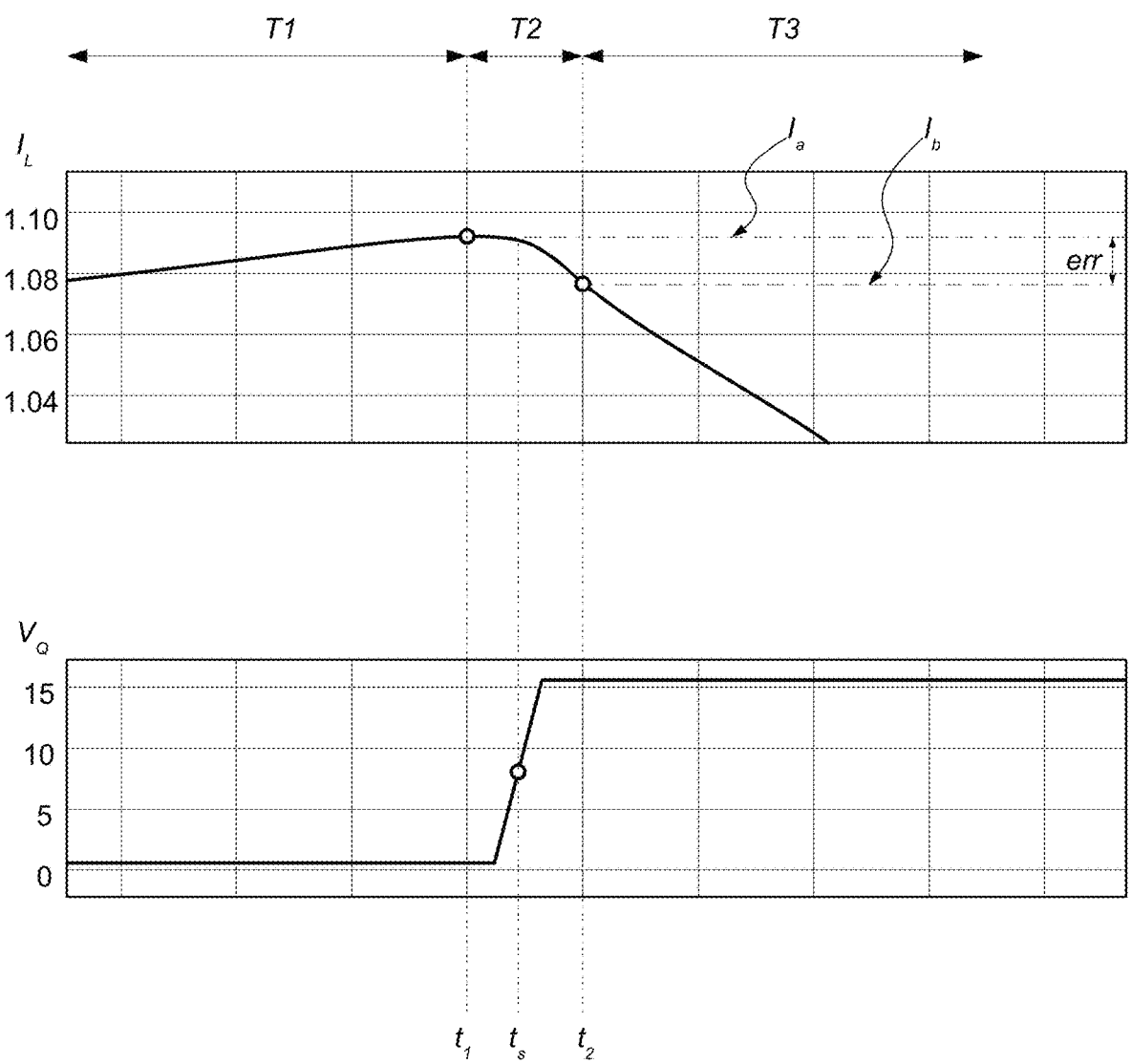
FIG. 3 illustrates an enlarged view of exemplary waveforms selected from FIG. 2B.

By way of example, FIG. 3 illustrates with greater detail exemplary waveforms of the load current $I_L$ and of the switching voltage $V_Q$ in the exemplary case of a low-side driver configuration with peak current measurement, as exemplified in FIGS. 1B and 2B.

As discussed previously, the two sample-and-hold circuits 14a and 14b may sample the load current at different sampling instants. For instance, the first sample-and-hold circuit 14a may sample the load current (low-side current, in the presently considered example) at an instant $t_1$ (end of interval T1 in FIG. 3) right before the switching instant $t_s$. The second sample-and-hold circuit 14b may sample the load current (high-side current, in the presently considered example) at an instant $t_2$ (start of interval T3 in FIG. 3) right after the switching instant $t_s$. Between instants instant $t_1$ and $t_2$ exists a sort of "blind zone" (interval T2 in FIG. 3) during which one switch in the half-bridge circuit is being activated and the other switch is being de-activated, so that the corresponding currents may not be reliably measured. However, this time interval may be sufficiently long to allow for the load current $I_L$ to change its value, even in non-faulty devices. As a result, the error signal err=$I_a$–$I_b$ may not be equal to zero even in non-faulty devices, as exemplified in FIG. 3.

Therefore, one or more embodiments may aim at compensating such an error. In particular, one or more embodiments may rely on the recognition that the load current $I_L$ has an approximately linear rate of change at least in a first portion of the time interval T3 which follows the current sampling effected by the second sample-and-hold circuit 14b.

Thus, one or more embodiments may additionally be configured to:

sample a third value of the load current $I_L$ after commutation of the half-bridge circuit (e.g., during the time interval T3), compute a compensation value as a difference between the second sampled value and the third sampled value, and subtract the compensation value from the error signal computed as a difference between the first sampled value and the second sampled value to generate a compensated error signal, wherein the compensated error signal may indicate more accurately possible failures of the device.

Figure 4A:
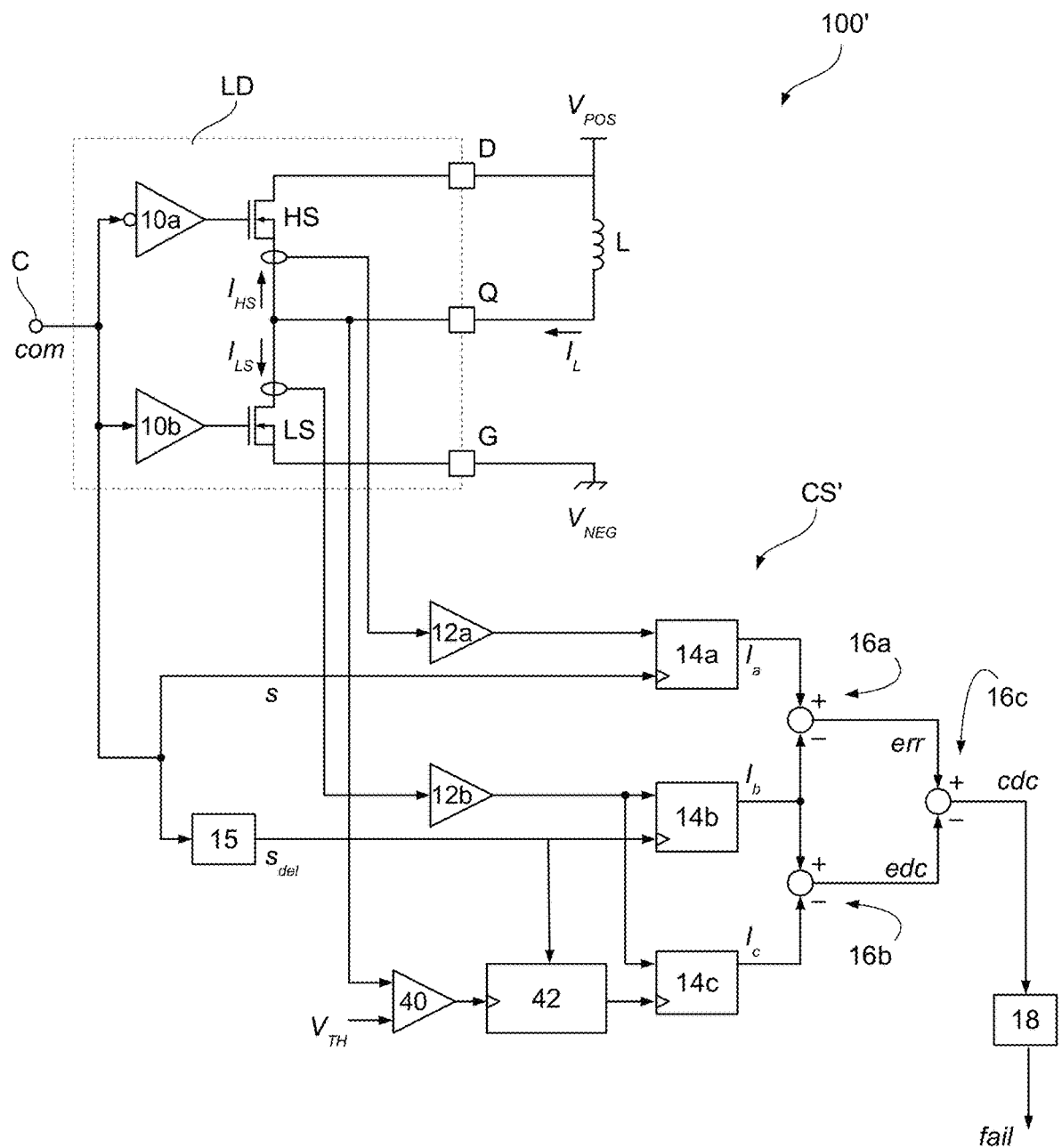
FIGS. 4A to 4D are circuit block diagrams exemplary of embodiments of a circuit configured to drive an inductive load and measure the load current, according to various possible configurations.
Figure 5A:
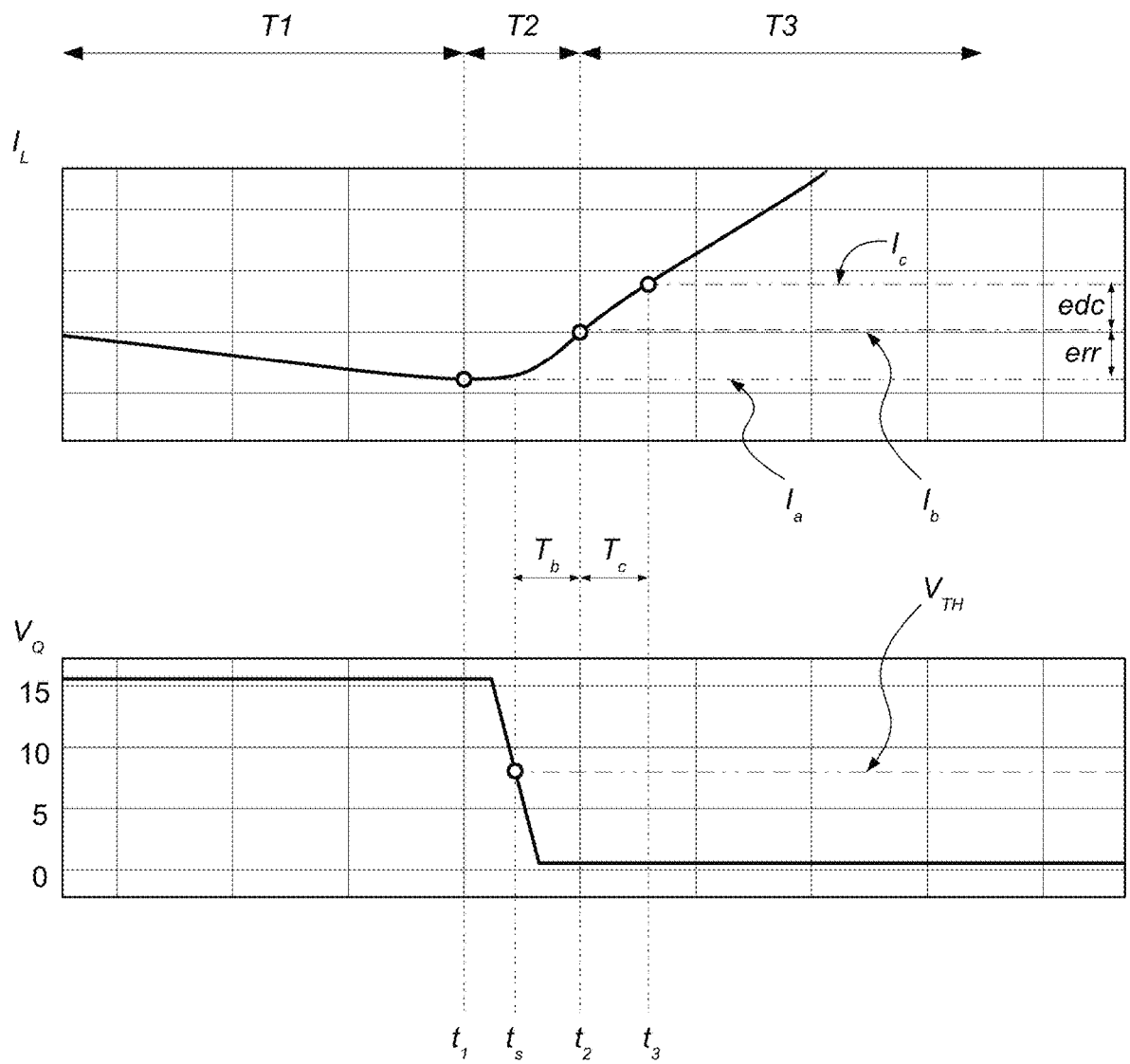
FIGS. 5A to 5D illustrate exemplary waveforms of signals in the circuits of FIGS. 4A to 4D, respectively.

FIG. 4A is a circuit block diagram exemplary of one or more embodiments of a circuit 100' configured for driving a load L, in particular an inductive load L, in a low-side driver configuration with valley load current measurement. FIG. 5A illustrates corresponding exemplary waveforms of the load current $I_L$ and of the switching voltage $V_Q$.

By way of comparison with the circuit of FIG. 1A, a current sensing circuit CS' as exemplified in FIG. 4A may comprise a comparator circuit 40 configured to compare the voltage signal $V_Q$ sensed at the intermediate node Q to a threshold value $V_{TH}$. The threshold value $V_{TH}$ may be selected to be between the values $V_{POS}$ and $V_{NEG}$, e.g., approximately in the middle of the supply voltage range, so that the comparator circuit 40 may assert and de-assert an output signal at the instants is corresponding to the switching points of the half-bridge circuit.

The current sensing circuit CS' may comprise an up-and-down counter circuit 42 having: a "start" input configured to receive the output signal from the comparator circuit 40, a "down" input configured to receive the signal $s_{del}$, and an "end" output configured to assert an output signal. An edge in the signal received at the "start" input may trigger up-counting from a reference count number (e.g., zero). A rising edge in the signal received at the "down" input may trigger reversing the count direction (e.g., starting down-counting) towards the reference count number. Reaching the reference count number may trigger the output signal of the up-and-down counter circuit 42.

Therefore, the up-and-down counter circuit 42 may be configured to start up-counting from a reference value (e.g., zero) as a result of the voltage $V_Q$ crossing the threshold $V_{TH}$, i.e., at the voltage switching instants $t_5$. The count direction may be reversed (i.e., the internal count number may start to decrease) as a result of a rising edge being sensed in the signal $s_{del}$ at the "down" input, i.e., at the sampling instant $t_2$. A time interval $T_b$ may thus elapse between instants $t_s$ and $t_2$. The output signal of the up-and-down counter circuit 42 may be asserted at an instant $t_3$ as a result of the internal count number going back to the initial reference value (e.g., zero), i.e., after a time interval $T_c = T_b$ from instant $t_2$.

The current sensing circuit CS' as exemplified in FIG. 4A may comprise a third sample-and-hold circuit 14c configured to sample the (digital) output signal from the current sense amplifier circuit 12b and driven by the output signal from the up-and-down counter circuit 42 (e.g., by the rising edges thereof). Therefore, a (digital) output signal $I_c$ may be provided at the output of the third sample-and-hold circuit 14c, the signal $I_c$ being indicative of the current flowing in the low-side switch at the sampling instant $t_3$.

The current sensing circuit CS' as exemplified in FIG. 4A may comprise a second subtractor circuit 16b configured to subtract the signal $I_c$ from the signal $I_b$ to generate a (digital) compensation signal edc indicative of the difference between the outputs of the sample-and-hold circuits 14b and 14c. A third subtractor circuit 16c may be configured to subtract the compensation signal edc from the error signal err to generate a (digital) compensated error signal cdc.

Therefore, a window comparator circuit 18 may be configured to receive the compensated error signal cdc to generate the output signal fail indicative of whether the compensated error signal cdc falls within a determined window of values or not, in a manner similar to that discussed with reference to FIGS. 1A to 1D.

Figure 4B:
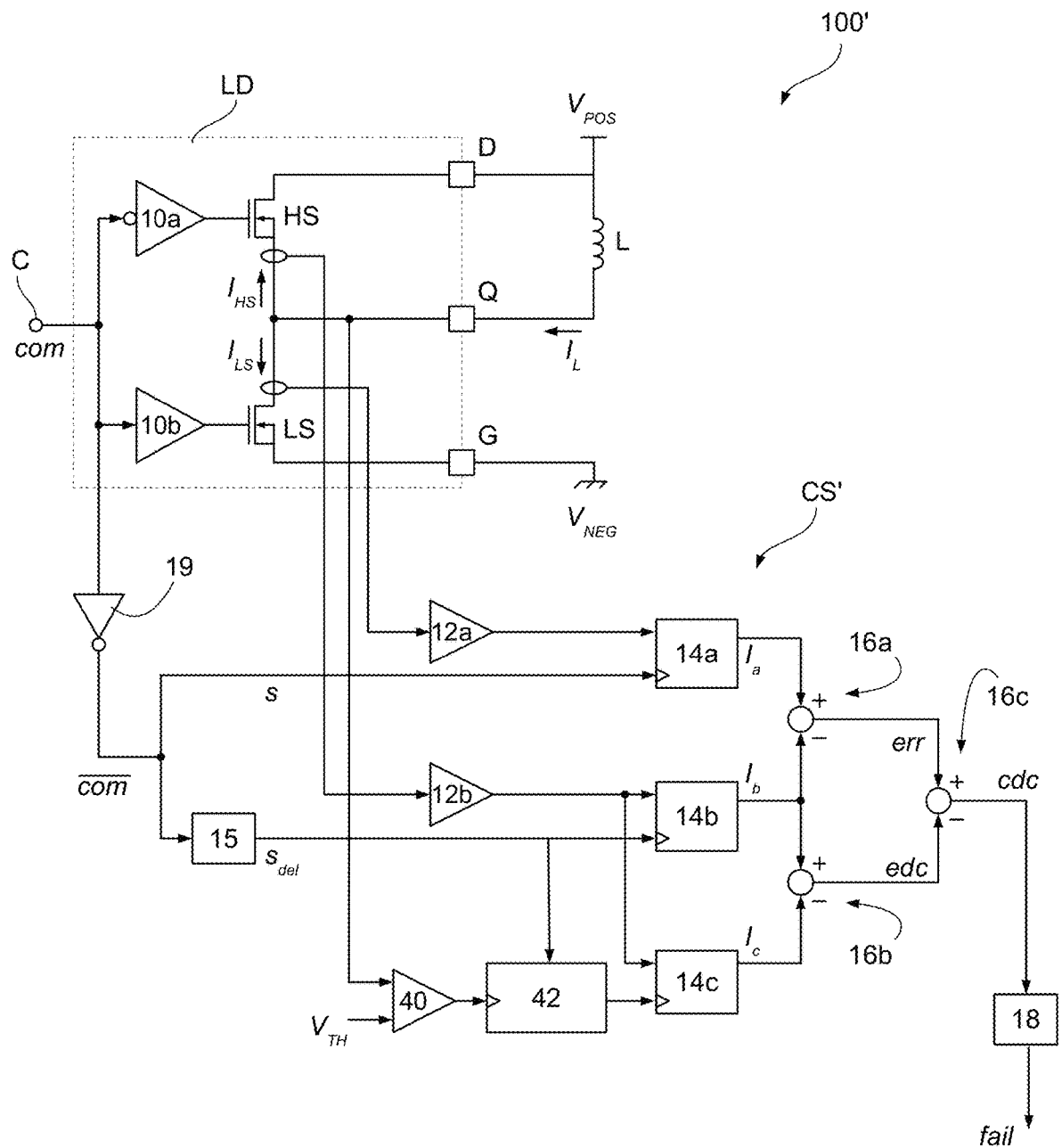
Figure 5B:
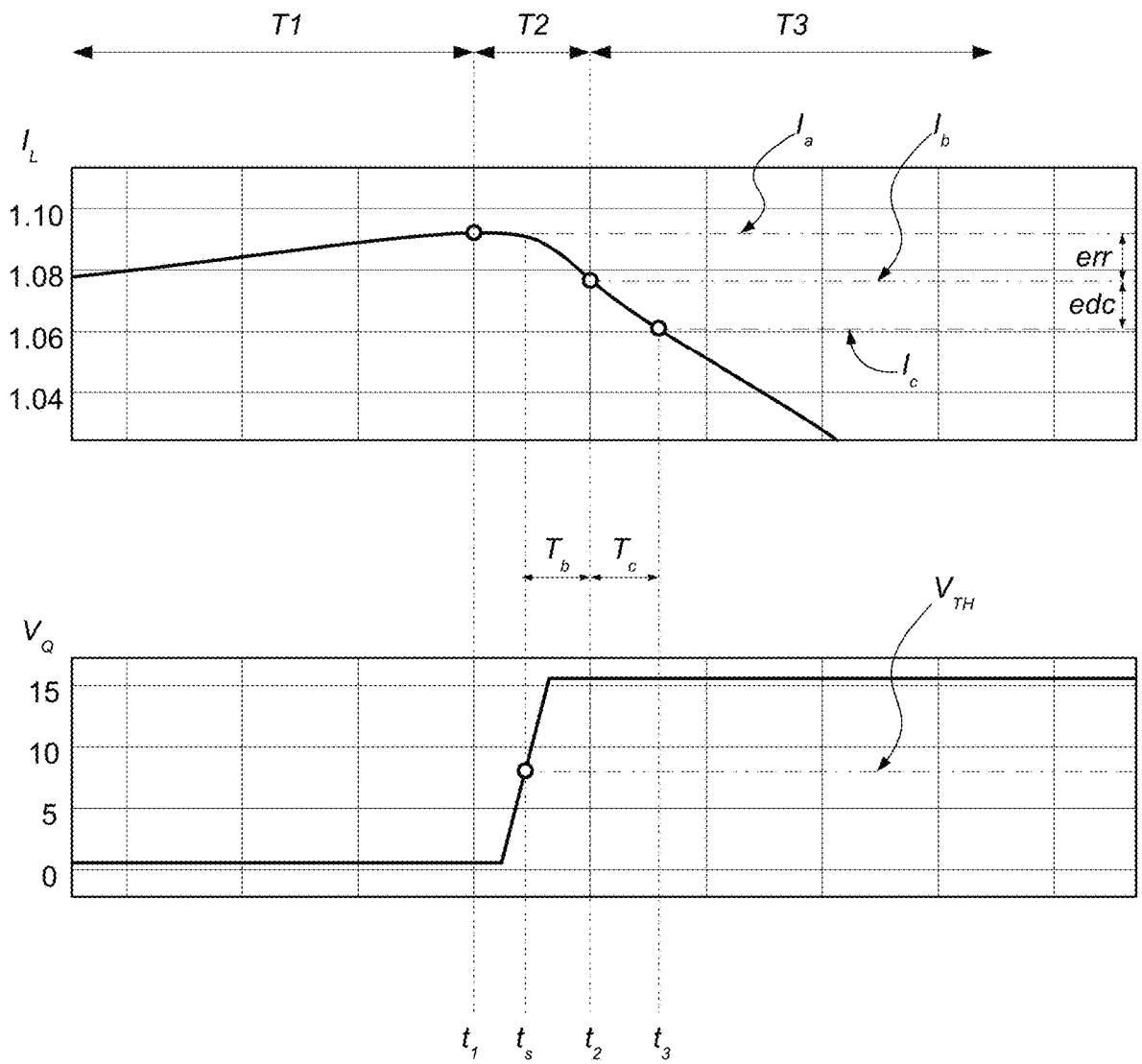

FIG. 4B is a circuit block diagram exemplary of a one or more embodiments of a circuit 100' configured for driving a load L, in particular an inductive load L, in a low-side driver configuration with peak load current measurement. FIG. 5B illustrates corresponding exemplary waveforms of the load current $I_L$ and of the switching voltage $V_Q$.

Figure 4C:
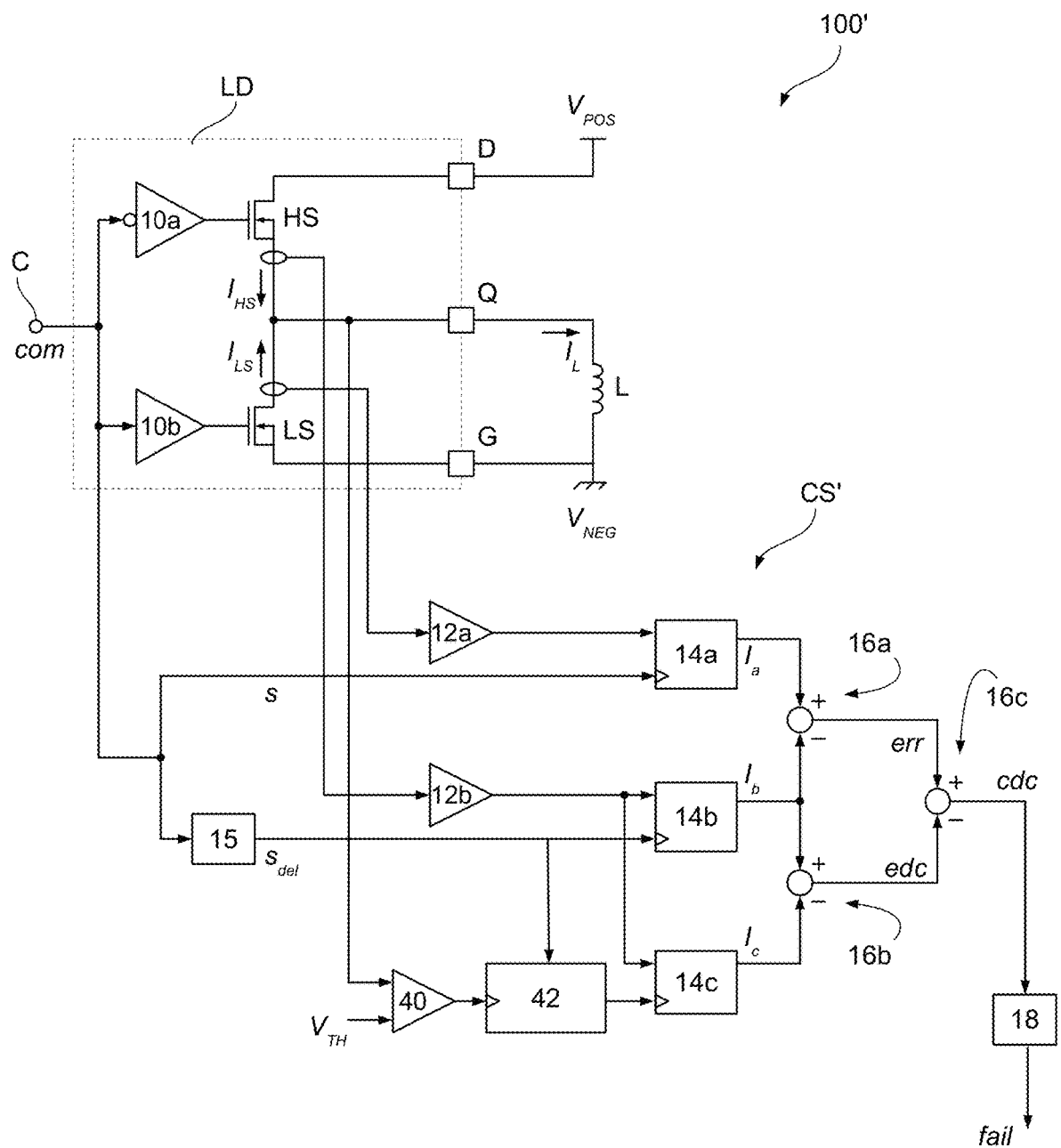
Figure 5C:
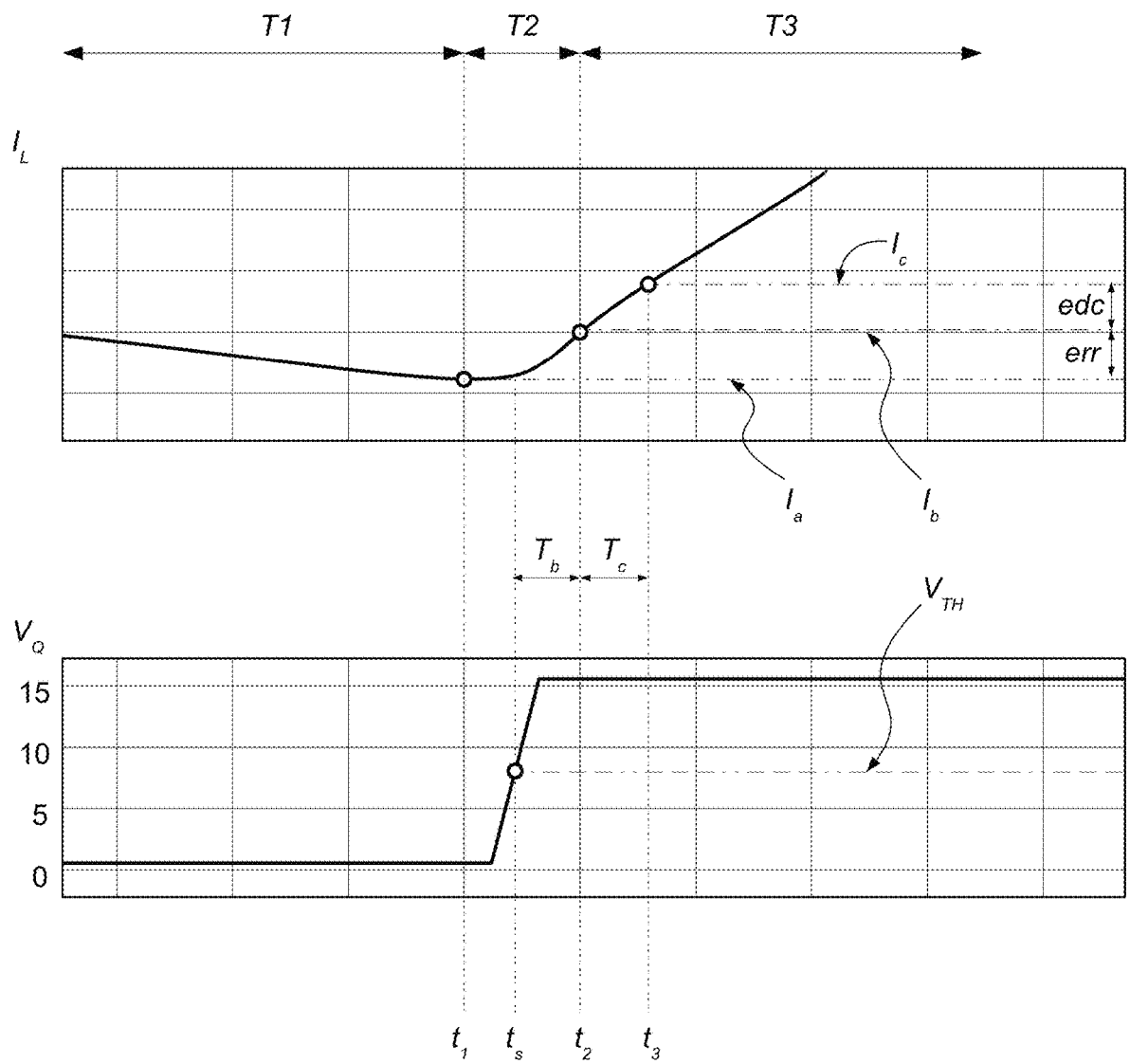

FIG. 4C is a circuit block diagram exemplary of a one or more embodiments of a circuit 100' configured for driving a load L, in particular an inductive load L, in a high-side driver configuration with valley load current measurement. FIG. 5C illustrates corresponding exemplary waveforms of the load current $I_L$ and of the switching voltage $V_Q$.

Figure 4D:
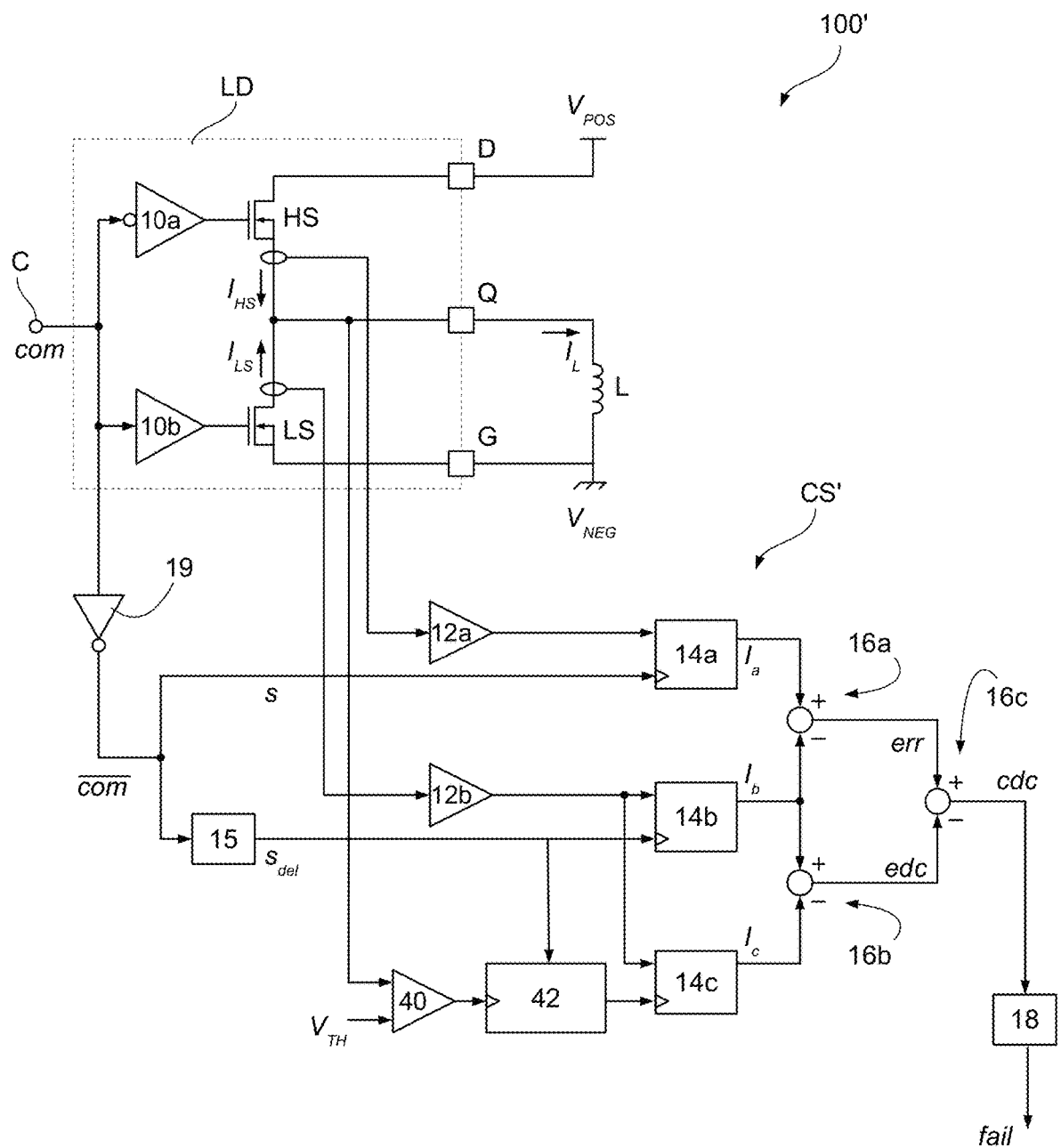
Figure 5D:
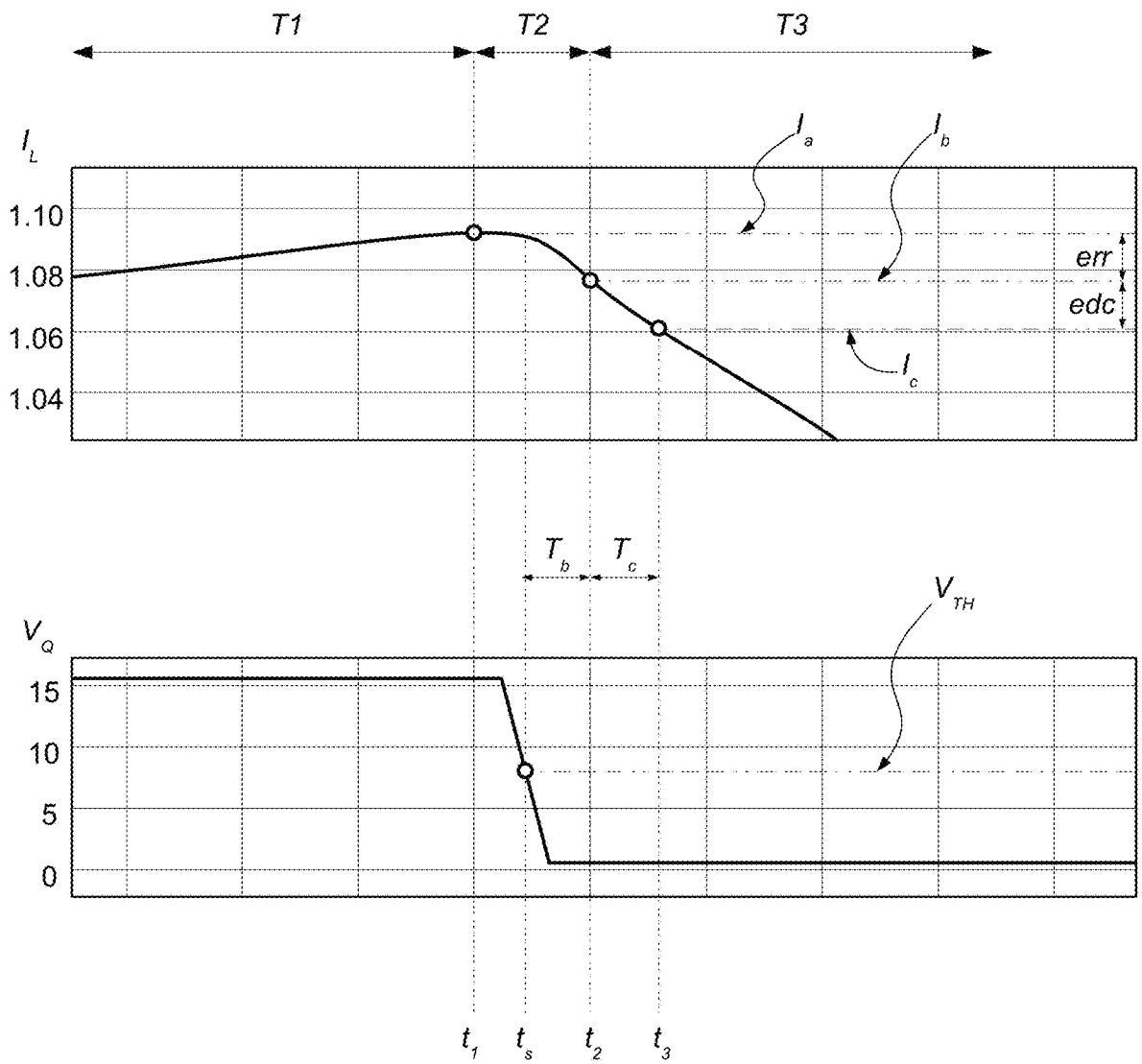

FIG. 4D is a circuit block diagram exemplary of a one or more embodiments of a circuit 100' configured for driving a load L, in particular an inductive load L, in a high-side driver configuration with peak load current measurement. FIG. 5D illustrates corresponding exemplary waveforms of the load current $I_L$ and of the switching voltage $V_Q$.

Therefore, one or more embodiments as exemplified in FIGS. 4A to 4D may generate a compensated error signal cdc which accounts for possible variations of the load current taking place during the switching "blind zone" T2. Various embodiments are applicable to a low-side or a high-side driver configuration, and to peak current measurement or valley current measurement.

It is noted that, while not being visible in FIGS. 4A to 4D for the sake of simplicity only, a current sensing circuit CS' in one or more embodiments as exemplified in any of FIGS. 4A to 4D may comprise an adder circuit 16 configured to sum the output signals from the first and second current sense amplifier circuits 12a, 12b to reconstruct a (digital) signal sum indicative of the overall current $I_L$ flowing in the load L.

Therefore, various embodiments as exemplified in the Figures annexed herein may share the common principle of:

sampling, at one of the high-side switch and the low-side switch, a first value $I_a$ of the current flowing in the load L at an instant $t_1$ before commutation of the driver circuit, sampling, at the other of the high-side switch and the low-side switch, a second value $I_b$ of the current flowing in the load L at an instant $t_2$ after commutation of the driver circuit, measuring a time interval $T_b$ elapsing between a switching instant $t_s$ of the driver circuit and the sampling instant $t_2$, sampling, at the other of the high-side switch and the low-side switch, a third value $I_c$ of the current flowing in the load L at an instant $t_3$, wherein the time interval $T_c$ elapsing between the sampling instant $t_2$ and the sampling instant $t_3$ is approximately equal to the time interval $T_b$, computing an error value err as a difference between the first value $I_a$ and the second value $I_b$, computing a compensation value edc as a difference between the second value $I_b$ and the third value $I_c$, computing a compensated error value cdc as a difference between the error value err and the compensation value edc, and detecting a possible failure of the driver circuit as a function of the compensated error value cdc.

It is noted that the first sampling may be effected at one of the high-side switch HS or the low-side switch LS depending on whether the sensing is performed at a valley or at a peak of the load current, and on whether the load is driven in a high-side driver configuration or in a low-side driver configuration. Correspondingly, the second and third sampling may be effected at the other of the high-side switch HS or the low-side switch LS.

It is noted that one or more embodiments (not visible in the Figures annexed herein) may rely on a simpler circuit architecture. For instance, the third sampling $I_c$ of the load current may be effected after a fixed time duration following the instant $t_2$ or the instant $t_s$.

In one or more embodiments, a load driver circuit LD and a current sensing circuit CS' as exemplified herein may be implemented in an application-specific integrated circuit (ASIC) 100' such as a solenoid driver integrated circuit which may be comprised, by way of example, in a transmission control unit or in a braking control unit of a vehicle.

Figure 6:
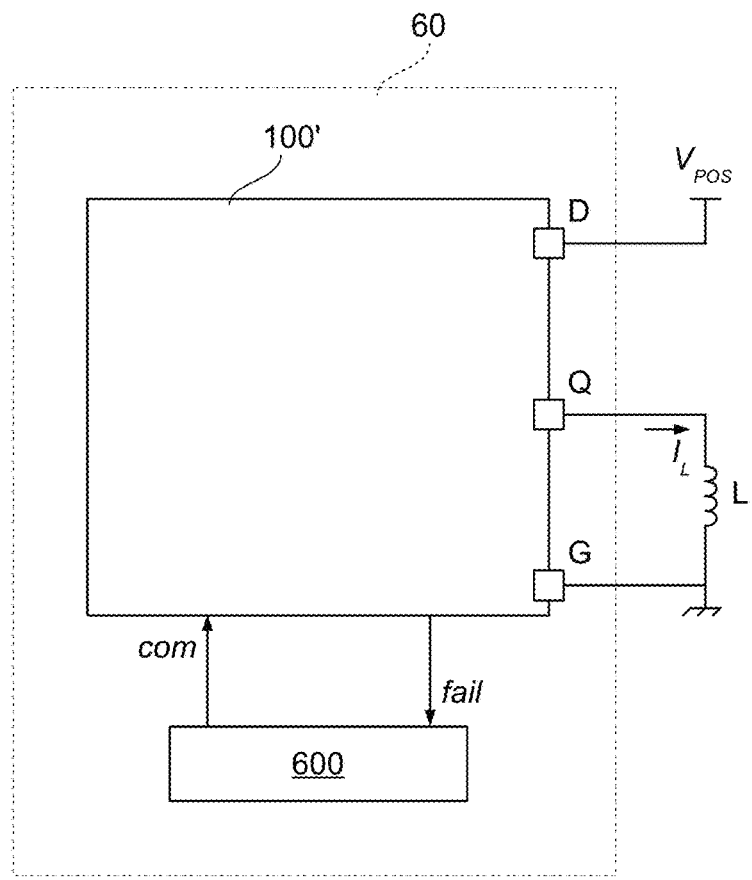
FIGS. 6 and 7 are exemplary of possible applications of one or more embodiments.
Figure 7:
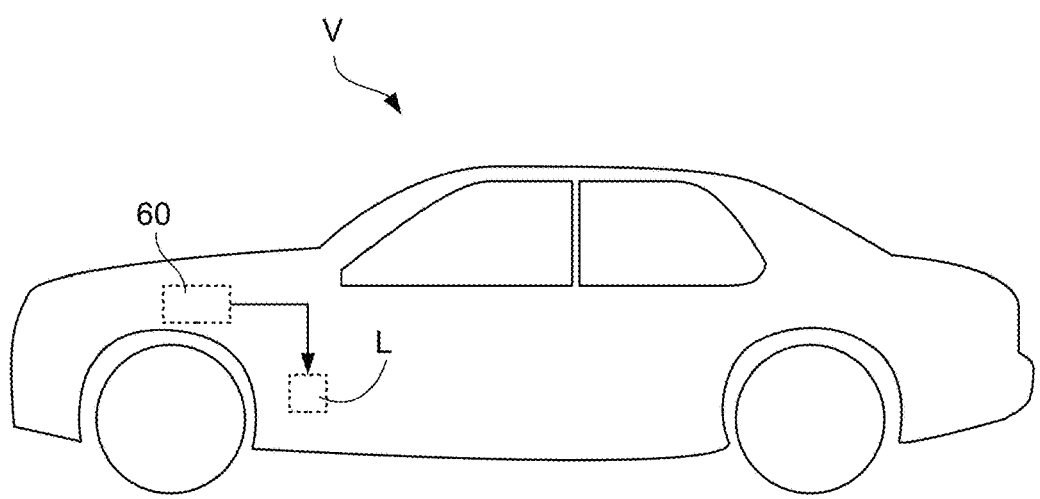

To this regard, FIG. 6 is exemplary of one or more embodiments of a device 60 such as a transmission control unit or a braking control unit comprising a driver circuit 100' and a processing unit 600 (e.g., a microcontroller unit of a vehicle). The processing unit 600 may be configured to provide the control signal com to the driver circuit 100', and to receive a failure signal fail from the driver circuit 100'.

FIG. 6 is exemplary of one or more embodiments of a vehicle V comprising a device 60 configured to control operation of an inductive actuator L, such as a solenoid.

One or more embodiments may thus provide improved accuracy in determining failures of a driver circuit for an inductive load, which may be particularly advantageous to fulfill safety requirements in the automotive field.

As exemplified herein, a circuit (e.g., 100') may comprise a high-side switch (e.g., HS) and a low-side switch (e.g., LS) having a node (e.g., Q) intermediate the high-side switch and the low-side switch, wherein the high-side switch is configured to provide a current flow line between a supply voltage node (e.g., D) and the intermediate node and the low-side switch is configured to provide a current flow line between the intermediate node and a reference voltage node (e.g., G). The circuit may comprise a control input node (e.g., C) configured to receive a switching control signal (e.g., com), the switching control signal being applied (e.g., 10a, 10b) with opposite polarities to the high-side switch and the low-side switch. The high-side switch and the low-side switch may be configured to drive an inductive load (e.g., L) coupled either between the supply voltage node and the intermediate node or between the intermediate node and the reference voltage node. During a first portion of a switching cycle of the switching control signal a load current (e.g., $I_L$) may flow in one of the high-side switch and the low-side switch, and during a second portion of the switching cycle of the switching control signal the load current may flow in the other of the high-side switch and the low-side switch.

As exemplified herein, a circuit may further comprise current sensing circuitry (e.g., CS') configured to:

sample (e.g., 12a, 14a) a first value (e.g., $I_a$) of the load current flowing in the one of the high-side switch and the low-side switch at a first sampling instant (e.g., $t_1$) during the first portion of a switching cycle before a commutation (e.g., $t_s$) of the switching control signal, sample (e.g., 12b, 14b) a second value (e.g., $I_b$) of the load current flowing in the other of the high-side switch and the low-side switch at a second sampling instant (e.g., $t_2$) during the second portion of a switching cycle after the commutation of the switching control signal, sample (e.g., 12b, 14c) a third value (e.g., $I_c$) of the load current flowing in the other of the high-side switch and the low-side switch at a third sampling instant (e.g., $t_3$) during the second portion of a switching cycle after the second sampling instant, and generate (e.g., 18) a failure signal (e.g., fail) as a function of the first, second and third sampled values of the load current.

As exemplified herein, the current sensing circuitry may be configured to:

subtract (e.g., 16a) the second sampled value of the load current from the first sampled value of the load current to generate an uncompensated error signal (e.g., err), subtract (e.g., 16b) the third sampled value of the load current from the second sampled value of the load current to generate a compensation signal (e.g., edc), subtract (e.g., 16c) the compensation signal from the uncompensated error signal to generate a compensated error signal (e.g., cdc), and generate the failure signal as a function of the compensated error signal.

As exemplified herein, generating the failure signal may comprise comparing the compensated error signal to at least one threshold value.

As exemplified herein, the current sensing circuitry may be configured to sample the third value of the load current after a time interval (e.g., $T_c$) from the second sampling instant. The time interval may be, for instance, a determined time interval of fixed duration.

As exemplified herein, a circuit may comprise a comparator circuit (e.g., 40) configured to sense a voltage signal (e.g., $V_Q$) at the intermediate node, and compare the voltage signal sensed to a threshold value (e.g., $V_{TH}$) to generate an output signal having edges indicative of switching instants of the intermediate node. The current sensing circuitry may be configured (e.g., 42) to sample the third value of the load current after a compensation time interval from the second sampling instant, and the compensation time interval may be a function of a time interval (e.g., $T_b$) elapsing between an edge of the output signal of the comparator circuit and the second sampling instant.

As exemplified herein, the compensation time interval may be equal to the time interval elapsing between an edge of the output signal of the comparator circuit and the second sampling instant.

As exemplified herein, the current sensing circuitry may comprise an up-and-down counter circuit (e.g., 42) configured to start counting an internal count number from a reference value at an edge of the output signal of the comparator circuit, reverse the direction of counting at the second sampling instant, and assert a respective output signal as a result of the internal count number returning to the reference value. The output signal of the up-and-down counter circuit may trigger the third sampling instant.

As exemplified herein, a device (e.g., 60) may comprise a circuit according to one or more embodiments and a processing unit (e.g., 600). The processing unit may be configured to provide the switching control signal to the circuit and to receive the failure signal from the circuit.

As exemplified herein, a vehicle (e.g., V) may comprise a device according to one or more embodiments, and an inductive actuator (e.g., a solenoid) coupled to the device and controlled by the circuit.

As exemplified herein, a method of operating a circuit according to one or more embodiments may comprise:

receiving a switching control signal and applying the switching control signal with opposite polarities to the high-side switch and the low-side switch, coupling an inductive load either between the supply voltage node and the intermediate node or between the intermediate node and the reference voltage node, sampling a first value of the load current flowing in the one of the high-side switch and the low-side switch at a first sampling instant before a commutation of the switching control signal, sampling a second value of the load current flowing in the other of the high-side switch and the low-side switch at a second sampling instant after the commutation of the switching control signal, sampling a third value of the load current flowing in the other of the high-side switch and the low-side switch at a third sampling instant after the second sampling instant, and generating a failure signal as a function of the first, second and third sampled values of the load current.

Without prejudice to the underlying principles, the details and embodiments may vary, even significantly, with respect to what has been described by way of example only, without departing from the extent of protection.

The extent of protection is determined by the annexed claims.

What is claimed is:

1. A circuit, comprising:
   a high-side switch and a low-side switch having an intermediate node intermediate the high-side switch and the low-side switch, wherein the high-side switch is configured to provide a first current flow line between a supply voltage node and the intermediate node and the low-side switch is configured to provide a second current flow line between the intermediate node and a reference voltage node;
   a control input node configured to receive a switching control signal, the switching control signal being applied with opposite polarities to the high-side switch and the low-side switch, wherein the high-side switch and the low-side switch are configured to drive an inductive load coupled either between the supply voltage node and the intermediate node or between the intermediate node and the reference voltage node, wherein during a first portion of a switching cycle of the switching control signal a load current flows in one of the high-side switch and the low-side switch, and during a second portion of the switching cycle of the switching control signal the load current flows in an other of the high-side switch and the low-side switch; and
   current sensing circuitry comprising:
      a first sample and hold circuit configured to sample a first value of the load current flowing in the one of the high-side switch and the low-side switch at a first sampling instant during the first portion of the switching cycle before a commutation of the switching control signal,
      a second sample and hold circuit configured to sample a second value of the load current flowing in the other of the high-side switch and the low-side switch at a second sampling instant during the second portion of the switching cycle after the commutation of the switching control signal,
      an up-and-down counter circuit configured to assert an output signal based on a comparison between a voltage signal at the intermediate node and a threshold value,
      a third sample and hold circuit configured to be driven by the output signal of the up-and-down counter circuit and sample a third value of the load current flowing in the other of the high-side switch and the low-side switch at a third sampling instant during the second portion of the switching cycle after the second sampling instant, and
      a plurality of subtractor circuits configured to generate a failure signal as a function of the first, second, and third sampled values of the load current.

2. The circuit of claim 1, wherein the subtractor circuits are configured to:
   subtract the second sampled value of the load current from the first sampled value of the load current to generate an uncompensated error signal;
   subtract the third sampled value of the load current from the second sampled value of the load current to generate a compensation signal;
   subtract the compensation signal from the uncompensated error signal to generate a compensated error signal; and
   generate the failure signal as a function of the compensated error signal.

3. The circuit of claim 2, wherein generating the failure signal comprises comparing the compensated error signal to at least one threshold value.

4. The circuit of claim 1, wherein the current sensing circuitry is configured to sample the third value of the load current after a time interval from the second sampling instant.

5. The circuit of claim 1, wherein the current sensing circuitry further comprises a comparator circuit configured to:
   sense the voltage signal at the intermediate node; and compare the voltage signal to the threshold value to generate the output signal having edges indicative of switching instants of the intermediate node;
wherein the third sample and hold circuit configured is configured to sample the third value of the load current after a compensation time interval from the second sampling instant, and wherein the compensation time interval is a function of a time interval elapsing between one edge of the output signal of the comparator circuit and the second sampling instant.

6. The circuit of claim 5, wherein the compensation time interval is equal to the time interval elapsing between the one edge of the output signal of the comparator circuit and the second sampling instant.

7. The circuit of claim 6, wherein the up-and-down counter circuit is configured to:
start counting an internal count number from a reference value at the one edge of the output signal of the comparator circuit;
reverse a direction of the counting at the second sampling instant; and
assert a respective output signal as a result of the internal count number returning to the reference value, wherein the output signal of the up-and-down counter circuit triggers the third sampling instant.

8. An apparatus comprising:
a circuit comprising:
a high-side switch and a low-side switch having an intermediate node intermediate the high-side switch and the low-side switch, wherein the high-side switch is configured to provide a first current flow line between a supply voltage node and the intermediate node and the low-side switch is configured to provide a second current flow line between the intermediate node and a reference voltage node;
a control input node configured to receive a switching control signal, the switching control signal being applied with opposite polarities to the high-side switch and the low-side switch, wherein the high-side switch and the low-side switch are configured to drive an inductive load coupled either between the supply voltage node and the intermediate node or between the intermediate node and the reference voltage node, wherein during a first portion of a switching cycle of the switching control signal a load current flows in one of the high-side switch and the low-side switch, and during a second portion of the switching cycle of the switching control signal the load current flows in an other of the high-side switch and the low-side switch; and
current sensing circuitry comprising:
a first sample and hold circuit configured to sample a first value of the load current flowing in the one of the high-side switch and the low-side switch at a first sampling instant during the first portion of the switching cycle before a commutation of the switching control signal,
a second sample and hold circuit configured to sample a second value of the load current flowing in the other of the high-side switch and the low-side switch at a second sampling instant during the second portion of the switching cycle after the commutation of the switching control signal,
an up-and-down counter circuit configured to assert an output signal based on a comparison between a voltage signal at the intermediate node and a threshold value,
a third sample and hold circuit configured to be driven by the output signal of the up-and-down counter circuit and sample a third value of the load current flowing in the other of the high-side switch and the low-side switch at a third sampling instant during the second portion of the switching cycle after the second sampling instant, and
a plurality of subtractor circuits configured to generate a failure signal as a function of the first, second, and third sampled values of the load current; and
a processing unit, configured to:
provide the switching control signal to the circuit; and
receive the failure signal from the circuit.

9. The apparatus of claim 8, wherein the apparatus is a vehicle, and wherein the vehicle further comprises an inductive actuator coupled to and controlled by the circuit.

10. The apparatus of claim 8, wherein the subtractor circuits are configured to:
subtract the second sampled value of the load current from the first sampled value of the load current to generate an uncompensated error signal;
subtract the third sampled value of the load current from the second sampled value of the load current to generate a compensation signal;
subtract the compensation signal from the uncompensated error signal to generate a compensated error signal; and
generate the failure signal as a function of the compensated error signal.

11. The apparatus of claim 10, wherein generating the failure signal comprises comparing the compensated error signal to at least one threshold value.

12. The apparatus of claim 8, wherein the current sensing circuitry is configured to sample the third value of the load current after a time interval from the second sampling instant.

13. The apparatus of claim 8, wherein the current sensing circuitry further comprises a comparator circuit configured to:
sense the voltage signal at the intermediate node; and
compare the voltage signal to the threshold value to generate the output signal having edges indicative of switching instants of the intermediate node;
wherein the third sample and hold circuit configured is configured to sample the third value of the load current after a compensation time interval from the second sampling instant, and wherein the compensation time interval is a function of a time interval elapsing between one edge of the output signal of the comparator circuit and the second sampling instant.

14. The apparatus of claim 13, wherein the compensation time interval is equal to the time interval elapsing between the one edge of the output signal of the comparator circuit and the second sampling instant.

15. The apparatus of claim 14, wherein the up-and-down counter circuit is configured to:
start counting an internal count number from a reference value at the one edge of the output signal of the comparator circuit;
reverse a direction of the counting at the second sampling instant; and
assert a respective output signal as a result of the internal count number returning to the reference value, wherein the output signal of the up-and-down counter circuit triggers the third sampling instant.

16. A method of operating a circuit, the method comprising:

receiving, by a control input node, a switching control signal;

applying the switching control signal with opposite polarities to a high-side switch and a low-side switch, the high-side and low-side switches having an intermediate node intermediate the high-side and low-side switches, providing, by the high-side switch, a first current flow line between a supply voltage node and the intermediate node;

providing, by the low-side switch, a second current flow line between the intermediate node and a reference voltage node;

coupling an inductive load either between the supply voltage node and the intermediate node or between the intermediate node and the reference voltage node;

sampling, by current sensing circuitry, a first value of a load current flowing in the one of the high-side switch and the low-side switch at a first sampling instant before a commutation of the switching control signal;

sampling, by the current sensing circuitry, a second value of the load current flowing in an other of the high-side switch and the low-side switch at a second sampling instant after the commutation of the switching control signal;

sensing, by a comparator circuit, a voltage signal at the intermediate node;

comparing, by the comparator circuit, the voltage signal sensed to a threshold value to generate an output signal having edges indicative of switching instants of the intermediate node;

sampling, by the current sensing circuitry, a third value of the load current flowing in the other of the high-side switch and the low-side switch at a third sampling instant after a compensation time interval from the second sampling instant, the compensation time interval being a function of a time interval elapsing between one edge of the output signal of the comparator circuit and the second sampling instant; and generating, by the current sensing circuitry, a failure signal as a function of the first, second and third sampled values of the load current.

17. The method of claim 16, further comprising:
subtracting, by the current sensing circuitry, the second sampled value of the load current from the first sampled value of the load current to generate an uncompensated error signal;
subtracting, by the current sensing circuitry, the third sampled value of the load current from the second sampled value of the load current to generate a compensation signal;
subtracting, by the current sensing circuitry, the compensation signal from the uncompensated error signal to generate a compensated error signal; and
generating, by the current sensing circuitry, the failure signal as a function of the compensated error signal.

18. The method of claim 17, wherein generating the failure signal comprises comparing the compensated error signal to at least one threshold value.

19. The method of claim 16, further comprising, sampling, by the current sensing circuitry, the third value of the load current after a time interval from the second sampling instant.

20. The method of claim 16, wherein the compensation time interval is equal to the time interval elapsing between the one edge of the output signal of the comparator circuit and the second sampling instant.

21. The method of claim 20, further comprising:
start counting, by an up-and-down counter circuit of the current sensing circuitry, an internal count number from a reference value at the one edge of the output signal of the comparator circuit;
reversing, by the up-and-down counter circuit, a direction of the counting at the second sampling instant;
asserting, by the up-and-down counter circuit, a respective output signal as a result of the internal count number returning to the reference value; and
triggering, by the output signal of the up-and-down counter circuit, the third sampling instant.

22. The method of claim 21, wherein the compensation time interval is equal to the time interval elapsing between the one edge of the output signal of the comparator circuit and the second sampling instant.

* * * * *